(12) United States Patent
Huang et al.

(10) Patent No.: US 12,356,750 B2
(45) Date of Patent: Jul. 8, 2025

(54) DEEP TRENCH ISOLATION FOR CROSS-TALK REDUCTION

(71) Applicant: Taiwan Semiconductor Manufacturing Co., Ltd., Hsinchu (TW)

(72) Inventors: Cheng Yu Huang, Hsinchu (TW); Wei-Chieh Chiang, Yuanlin Township (TW); Keng-Yu Chou, Kaohsiung (TW); Chun-Hao Chuang, Hsinchu (TW); Wen-Hau Wu, New Taipei (TW); Chih-Kung Chang, Zhudong Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 747 days.

(21) Appl. No.: 17/411,526

(22) Filed: Aug. 25, 2021

(65) Prior Publication Data

US 2022/0359583 A1    Nov. 10, 2022

Related U.S. Application Data

(60) Provisional application No. 63/184,423, filed on May 5, 2021.

(51) Int. Cl.
*H10F 39/00* (2025.01)
*H10F 39/18* (2025.01)

(52) U.S. Cl.
CPC ......... *H10F 39/807* (2025.01); *H10F 39/011* (2025.01); *H10F 39/182* (2025.01); *H10F 39/8053* (2025.01); *H10F 39/8063* (2025.01)

(58) Field of Classification Search
CPC ..................................... H10F 39/807
See application file for complete search history.

(56) References Cited

U.S. PATENT DOCUMENTS

| | | | |
|---|---|---|---|
| 9,754,993 B2 * | 9/2017 | Chou | H01L 21/76229 |
| 10,073,239 B1 * | 9/2018 | Jung | H04N 23/67 |
| 10,833,117 B2 * | 11/2020 | Shim | H10F 39/8053 |

(Continued)

FOREIGN PATENT DOCUMENTS

| | | | |
|---|---|---|---|
| KR | 20040055868 A | | 6/2004 |
| KR | 20050009625 A | | 1/2005 |

*Primary Examiner* — Ali Naraghi
(74) *Attorney, Agent, or Firm* — Eschweiler & Potashnik, LLC

(57) ABSTRACT

Some embodiments relate to a CMOS image sensor disposed on a substrate. A plurality of pixel regions comprising a plurality of photodiodes, respectively, are configured to receive radiation that enters a back-side of the substrate. A boundary deep trench isolation (BDTI) structure is disposed at boundary regions of the pixel regions, and includes a first set of BDTI segments extending in a first direction and a second set of BDTI segments extending in a second direction perpendicular to the first direction to laterally surround the photodiode. The BDTI structure comprises a first material. A pixel deep trench isolation (PDTI) structure is disposed within the BDTI structure and overlies the photodiode. The PDTI structure comprises a second material that differs from the first material, and includes a first PDTI segment extending in the first direction such that the first PDTI segment is surrounded by the BDTI structure.

16 Claims, 14 Drawing Sheets

(56) References Cited

U.S. PATENT DOCUMENTS

| | | |
|---|---|---|
| 2001/0055842 A1 | 12/2001 | Uh et al. |
| 2012/0032240 A1 | 2/2012 | Mayuzumi |
| 2017/0047367 A1 | 2/2017 | Lee et al. |
| 2017/0062495 A1* | 3/2017 | Huang ............... H10F 39/014 |
| 2019/0096930 A1* | 3/2019 | Chuang ............... H10F 39/807 |
| 2019/0165009 A1* | 5/2019 | Wu ..................... H10F 39/182 |
| 2020/0098798 A1 | 3/2020 | Takahashi et al. |
| 2020/0243578 A1 | 7/2020 | Pyo et al. |
| 2020/0343281 A1 | 10/2020 | Wu et al. |
| 2021/0134863 A1 | 5/2021 | Suzuki |

* cited by examiner

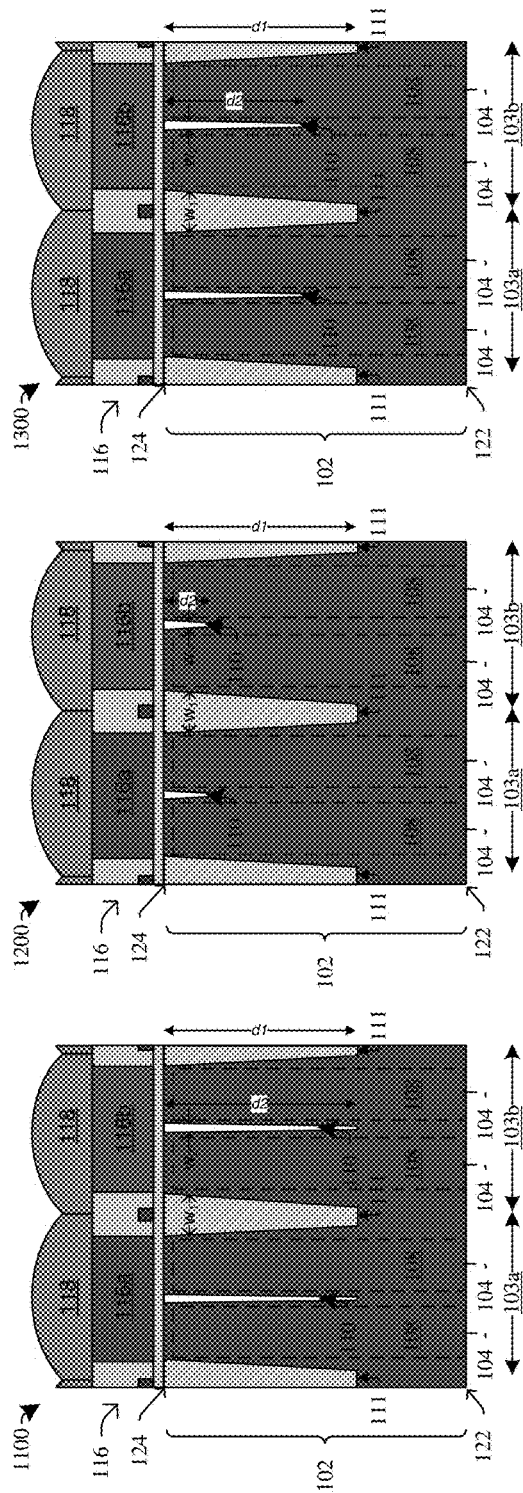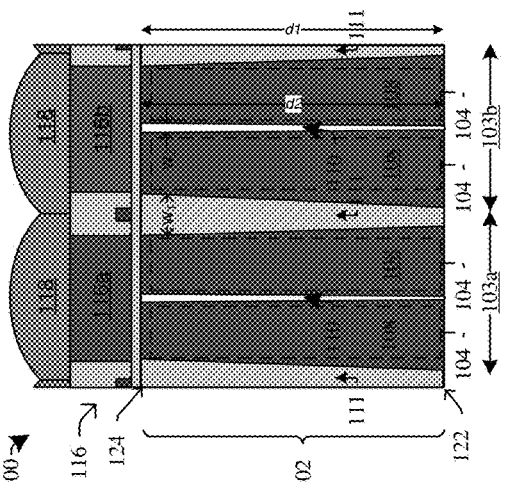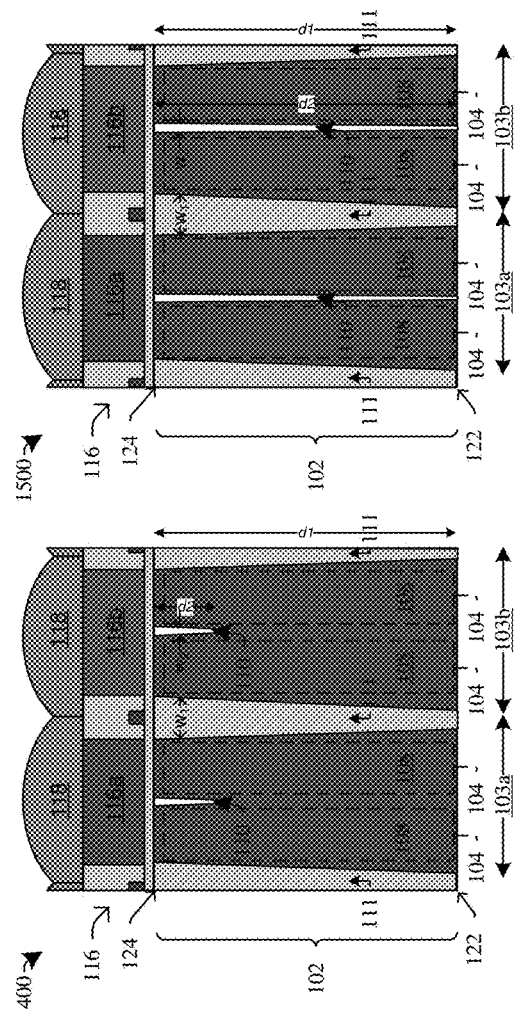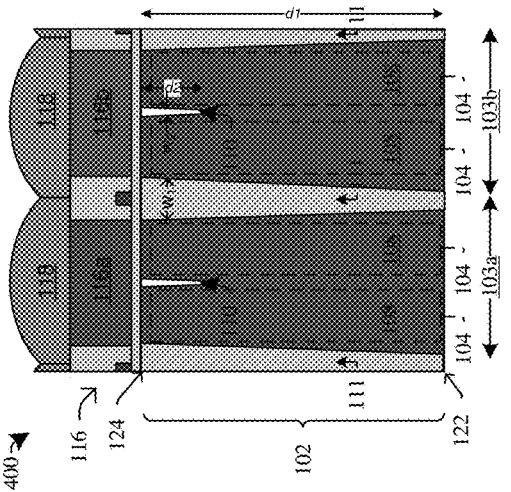

DEEP TRENCH ISOLATION FOR CROSS-TALK REDUCTION

REFERENCE TO RELATED APPLICATION

This application claims the benefit of U.S. Provisional Application No. 63/184,423, filed on May 5, 2021, the contents of which are hereby incorporated by reference in their entirety.

BACKGROUND

Digital cameras and optical imaging devices employ image sensors. Image sensors convert optical images to digital data that may be represented as digital images. An image sensor includes a pixel array (or grid) for detecting light and recording intensity (brightness) of the detected light. The pixel array responds to the light by accumulating a charge for each pixel. The accumulated charge is then used (for example, by other circuitry) to provide a color and brightness signal for use in a suitable application, such as a digital camera or digital display. Pixel sensors often manifest as charge-coupled devices (CCDs) or complementary metal oxide semiconductor (CMOS) devices. Relative to CCD pixel sensors, CMOS pixel sensors provide lower power consumption, smaller size, and faster data processing. Further, CMOS pixel sensors provide a direct digital output of data and generally have a lower manufacturing cost compared with CCD pixel sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11-15 illustrate a plurality of cross-sectional views of some additional embodiments of a CMOS image sensor where the BDTI and PDTI have varying depths.

DETAILED DESCRIPTION

Figure 1:
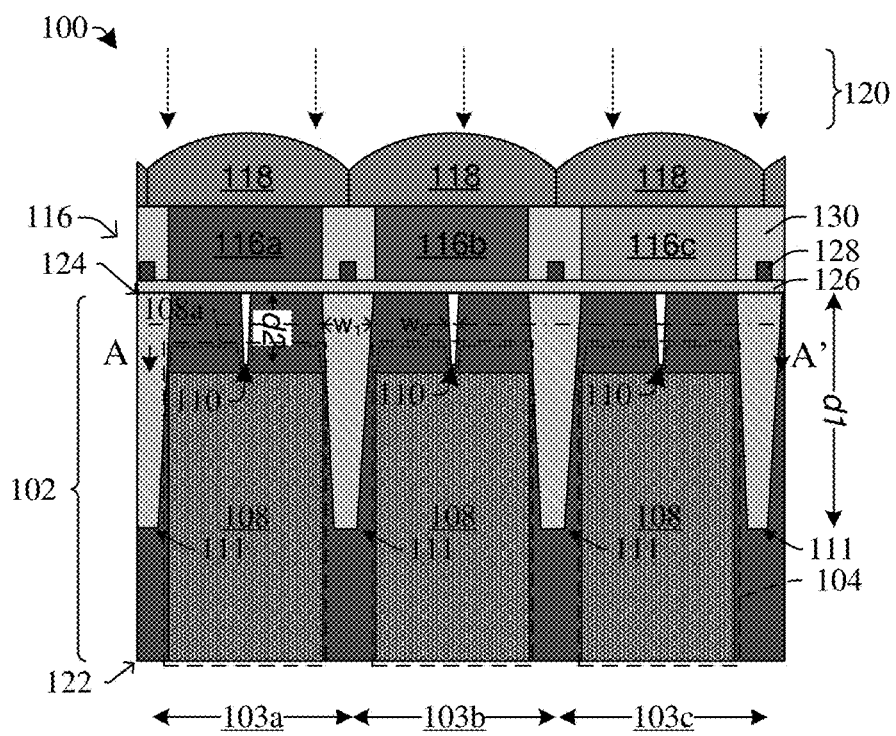
FIG. 1 illustrates a cross-sectional view of some embodiments of a CMOS (complementary metal-oxide-semiconductor) image sensor including a boundary deep trench isolation (BDTI) structure and a pixel deep trench isolation structure (PDTI).

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many portable electronic devices (e.g., cameras, cellular telephones, computers, etc.) include an image sensor for capturing images. One example of such an image sensor is a CMOS image sensor (CIS) including an array of individual pixel regions corresponding to an array of color filters. Thus, due to the array of color filters, the individual pixels can correspond to different colors and can collectively provide a digital image including these colors.

The present disclosure relates to a CMOS image sensor comprising pixel deep trench isolation (PDTI) structure disposed within each individual pixel region, and an associated method of formation. In some embodiments, the CMOS image sensor has a plurality of pixel regions disposed on the substrate and respectively comprising a photodiode configured to convert radiation that enters the substrate from the back-side into an electrical signal. A boundary deep trench isolation (BDTI) structure includes segments that laterally surround the photodiodes, extending from the back-side of the substrate to a first depth within the substrate, and wherein the photodiodes are arranged within openings between the segments. A pixel deep trench isolation (PDTI) structure is disposed within the individual pixel region, extending from the back-side of the substrate to a second depth within the substrate, and overlying the photodiode. The BDTI structure comprises or is made of metal or polysilicon, and the PDTI structure comprises or is made of oxide or dielectric material. The BDTI structure and PDTI structure decrease lateral photon crosstalk between adjacent pixels and increase quantum efficiency for the pixels, relative to other CMOS image sensors.

FIG. 1 illustrates a cross-sectional view 100 of some embodiments of a CMOS image sensor having a pixel deep trench isolation (PDTI) structure. The CMOS image sensor comprises a substrate 102 having a front-side 122 and a back-side 124. In various embodiments, the substrate 102 may comprise any type of semiconductor body (e.g., silicon/CMOS bulk, SiGe, etc.) such as a semiconductor wafer or one or more die, as well as any other type of semiconductor and/or epitaxial layers formed thereon and/or otherwise associated therewith. The substrate 102 comprises a plurality of pixel regions that may be arranged within the substrate 102 in an array comprising rows and/or columns, such as pixel regions 103a, 103b, 103c shown in FIG. 1. The pixel regions 103a, 103b, 103c comprise respective photodiodes 104 that are configured to convert incident radiation 120 (e.g., photons) into an electric signal. In some embodiments, the photodiode 104 comprises a doped layer 108 within the substrate 102 having a first doping type (e.g., n-type doping) and an adjoining region of the substrate 102 having a second doping type (e.g., p-type doping) that is different than the first doping type. The doped layer 108 and the adjoining region of the substrate 102 form a depletion region at an interface region of a P-N junction structure. When a photon of sufficient energy strikes the photodiode 104, an electron-hole pair is generated and then swept from the P-N junction by the built-in electric field of the depletion region. Thus a photocurrent is produced.

In some embodiments, a plurality of color filters 116 is arranged over the back-side 124 of the substrate 102. The plurality of color filters 116 is respectively configured to transmit specific wavelengths of incident radiation 120. For example, a first color filter 116a (e.g., a red color filter) may transmit light having wavelengths within a first range, while a second color filter 116b may transmit light having wavelengths within a second range different than the first range, and a third color filter 116c may transmit light having wavelengths within a third range different than the first range and second range. As an example, the plurality of color filters 116 may comprise RGB on-chip color filter on each pixel in Bayer pattern, which consists of a 2×2 color unit cell with two green filters in the diagonal positions and blue and red in the off-diagonal positions. In some embodiments, the plurality of color filters 116 may be arranged within a grid structure overlying the substrate 102. In some embodiments, the grid structure may overlie a dielectric layer 126, and may include a metal framework 128 surrounded by a dielectric material 130. In some embodiments, the dielectric layer 126 and the dielectric material 130 may be the same dielectric material (e.g., silicon dioxide ($SiO_2$)).

A plurality of micro-lenses 118 is arranged over the plurality of color filters 116 to increase sensor sensitivity. Respective micro-lenses 118 are aligned laterally with the color filters 116 and overlie the pixel regions 103a, 103b, 103c. In some embodiments, the plurality of micro-lenses 118 has a substantially flat bottom surface abutting the plurality of color filters 116 and a curved upper surface. The curved upper surface is configured to focus the incident radiation 120 (e.g., light towards the underlying pixel regions 103a, 103b, 103c). During operation of the CMOS image sensor, the incident radiation 120 is focused by the micro-lens 118 to the underlying pixel regions 103a, 103b, 103c. When incident radiation of sufficient energy strikes the photodiode 104, it generates an electron-hole pair that produces a photocurrent. Notably, though the micro-lenses 118 is shown as fixed onto the image sensor in FIG. 1, it is appreciated that the image sensor may not include on-chip micro-lens, and the micro-lens may be attached to the image sensor later in a separate manufacturing activity.

A boundary deep trench isolation (BDTI) structure 111 is disposed in the substrate 102, extending from the back-side 124 to a first depth d1 within the substrate 102. The BDTI structure 111 laterally surrounds each photodiode 104, and isolates adjacent pixel regions from one another. The BDTI structure 111 comprises a first material, such as metal or polysilicon. For example, in some embodiments where the first material is a metal, the metal comprises aluminum, copper, and/or tungsten. The BDTI structure 111 also has a first trench width w1 as measured along a plane corresponding to line A-A'.

A pixel deep trench isolation (PDTI) structure 110 is disposed within the individual pixel region 103a, 103b, 103c, extending from the back-side 124 of the substrate 102 to a second depth d2 within the substrate 102, and overlying the photodiode 104. The PDTI structure 110 comprises a second material that differs from the first material, and in some embodiments the second material is a dielectric material or an oxide material. The PDTI structure 110 includes a first PDTI segment 110a that has a second trench width w2 as measured along a plane corresponding to line A-A'. The bottom of the PDTI structure 110 can reside above an upper surface of doped layer 108 (as shown), or alternatively upper surface of doped region can be "raised" to within the depth d2 of the PDTI structure (as shown by dashed line 108a).

In some embodiments, the second trench width w2 is less than the first trench width w1, and w2 can range from approximately 10% of w1 to 90% of w1, and is between 45% of w1 and 55% of w1 in some cases. In other cases, w2 and w1 are equal to one another. In some embodiments, a ratio of the second trench width w2 to the first trench width w1 is in a range of from about 1:1 to about 1:4. Further, in some embodiments, the first depth d1 is greater than the second depth d2. A ratio of the first depth d1 to the second depth d2 may be in a range of from about 1:2 to about 1:6. The BDTI structure 111 extends from a planar top surface of the substrate 102 to a position lower than a top surface of the doped layer 108, while the PDTI structure 110 extends from the planar top surface of the substrate 102 to a position above the top surface of the doped layer 108. The doped layer 108 and the PDTI structure 110 may be separated by the substrate 102.

It has been appreciated in this disclosure that a BDTI structure made of metal or polysilicon reduces cross-talk compared to a BDTI structure made of oxide. However, a BDTI structure made of metal or polysilicon also degrades quantum efficiency (QE) compared to a BDTI structure made of oxide. Thus, providing the BDTI structure 111 of metal or polysilicon while the PDTI structure 110 is dielectric material can provide a good blend of low cross-talk and high QE.

For example, Table I below shows some findings for some embodiments of the present disclosure that compares the QE for Red/Green/Blue peaks and the percentage of cross-talk between adjacent pixels for different configurations.

TABLE 1

QE and Cross-talk for PDTI and BDTI structures having various material compositions

| BDTI structure material | PDTI structure material | | | |
|---|---|---|---|---|
|  | Oxide | Aluminum | Oxide (w1) | Oxide (w1) |
|  | Oxide | Aluminum | Aluminum (w1) | Aluminum (w2 > w1) |
| Normalized QE R/G/B(%) | 81/100/91 | 69/88/73 | 78/100/91 | 75/101/92 |
| Cross-talk (%) | 16.9 | 13.1 | 13.1 | 12.3 |

As shown above in Table I, forming the PDTI structure 110 of oxide and the BDTI structure 111 of a metal, such as aluminum, provides a higher quantum efficiency than when the PDTI structure 110 and BDTI structure 111 are both made of aluminum. Further, forming the PDTI structure 110 of oxide and the BDTI structure 111 of a metal, such as aluminum, provides a significantly lower cross-talk than when the PDTI structure 110 and BDTI structure 111 are both made of oxide. Thus, some embodiments of the present disclosure provide a CMOS image sensor that gives a good balance of improved QE and reduced cross-talk that is a good solution for some applications.

Figure 2:
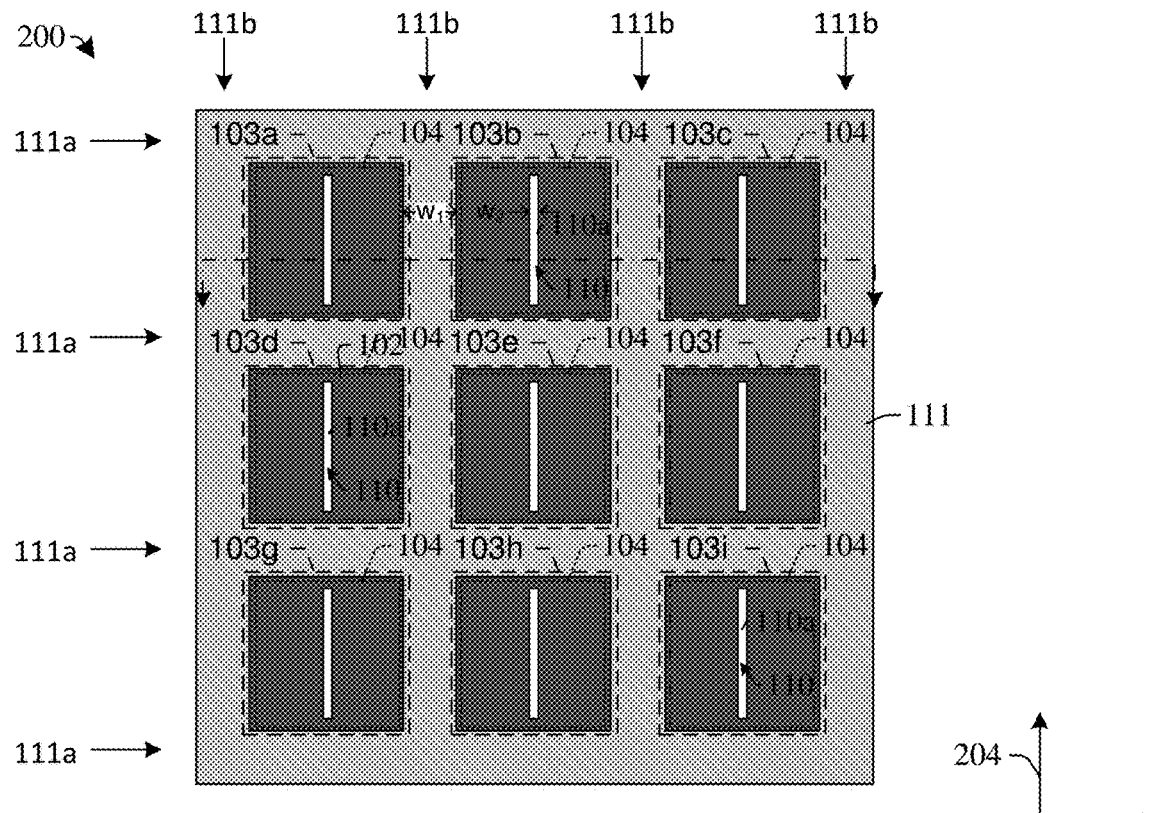
FIGS. 2-4 illustrate various top views of embodiments consistent with the CMOS image sensor of FIG. 1 along line A-A'.

FIG. 2 illustrates a top view 200 of a CMOS image sensor consistent with FIG. 1 along line A-A'. The BDTI structure 111 laterally surrounds the respective pixel regions 103a-103i, and laterally isolates these pixel regions from one another, such that crosstalk between the pixel regions can be reduced. Thus, the BDTI structure 111 is disposed at boundary regions of the pixel regions 103a-103i, and includes a first set of BDTI segments 111a extending in a first direction 202 and a second set of BDTI segments 111b extending in a second direction 204 perpendicular to the first direction 202 to laterally surround the photodiodes 104. The PDTI structure 110 is disposed overlying individual pixel regions, and confines and directs the incident radiation 120 down to the photodiode 104 of the corresponding pixel region, such that quantum efficiency of the image sensor is improved. Within each pixel, the PDTI structure 110 includes a first PDTI segment 110a extending in the first direction 202 such that the first PDTI segment 110a is surrounded by the BDTI structure 111. The first PDTI segment 110a is a linear segment along a centerline of the pixel and spaced apart from innermost edges of the BDTI structure 111, such that the first PDTI segment, if extended, would bisect the pixel into two equal areas.

Figure 3:
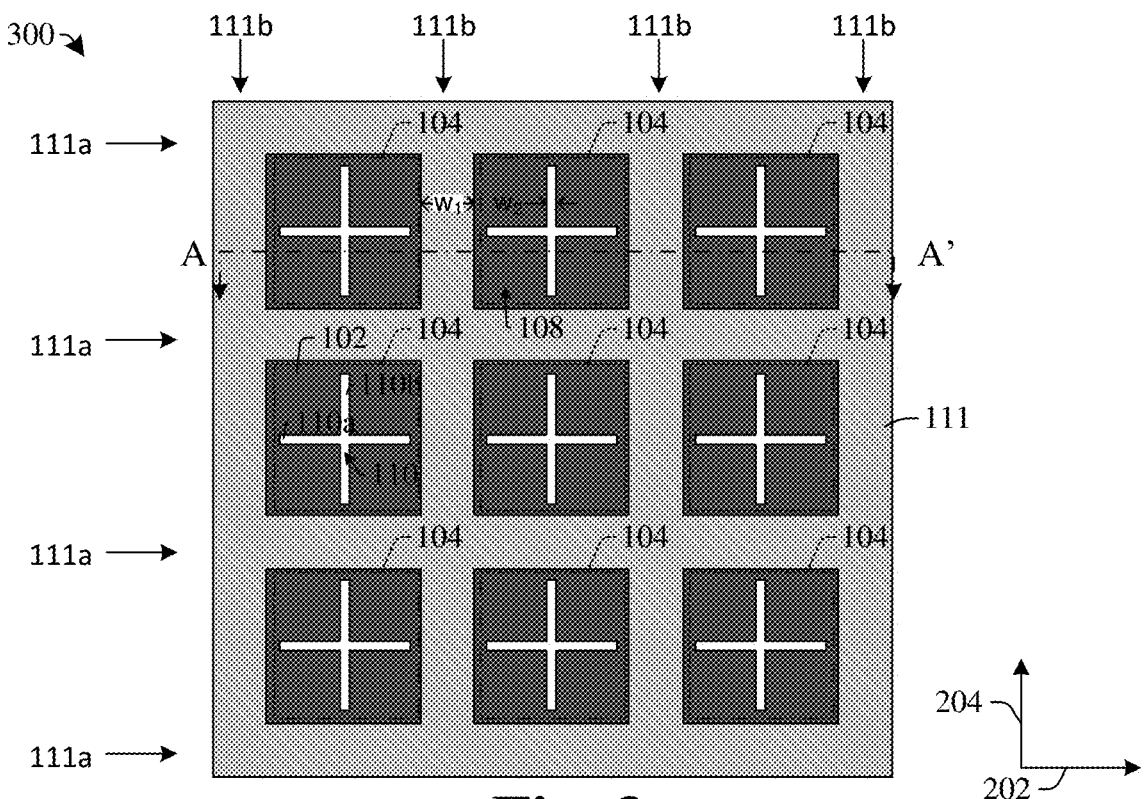

FIG. 3 illustrates another top view 300 of a CMOS image sensor consistent with FIG. 1 along line A-A'. In FIG. 3, the BDTI structure 111 is again disposed at boundary regions of the pixel regions, and includes a first set of BDTI segments 111a extending in a first direction 202 and a second set of BDTI segments 111b extending in a second direction 204 perpendicular to the first direction to laterally surround the photodiodes 104. Within each pixel, the PDTI structure 110 of FIG. 3 includes a first PDTI segment 110a extending in the first direction as well as a second PDTI segment 110b extending in the second direction, such that the first PDTI segment 110a and second PDTI segment 110b form a "plus" shape or "t"-shape that is surrounded by the BDTI structure 111. The first PDTI segment 110a is along a centerline of the pixel and extends in the first direction 202 and the second PDTI segment is along a centerline of the pixel and extends in the second direction 204, such that the first and second PDTI segments, if extended, would cut the corresponding pixels into four equal quadrants.

Figure 4:
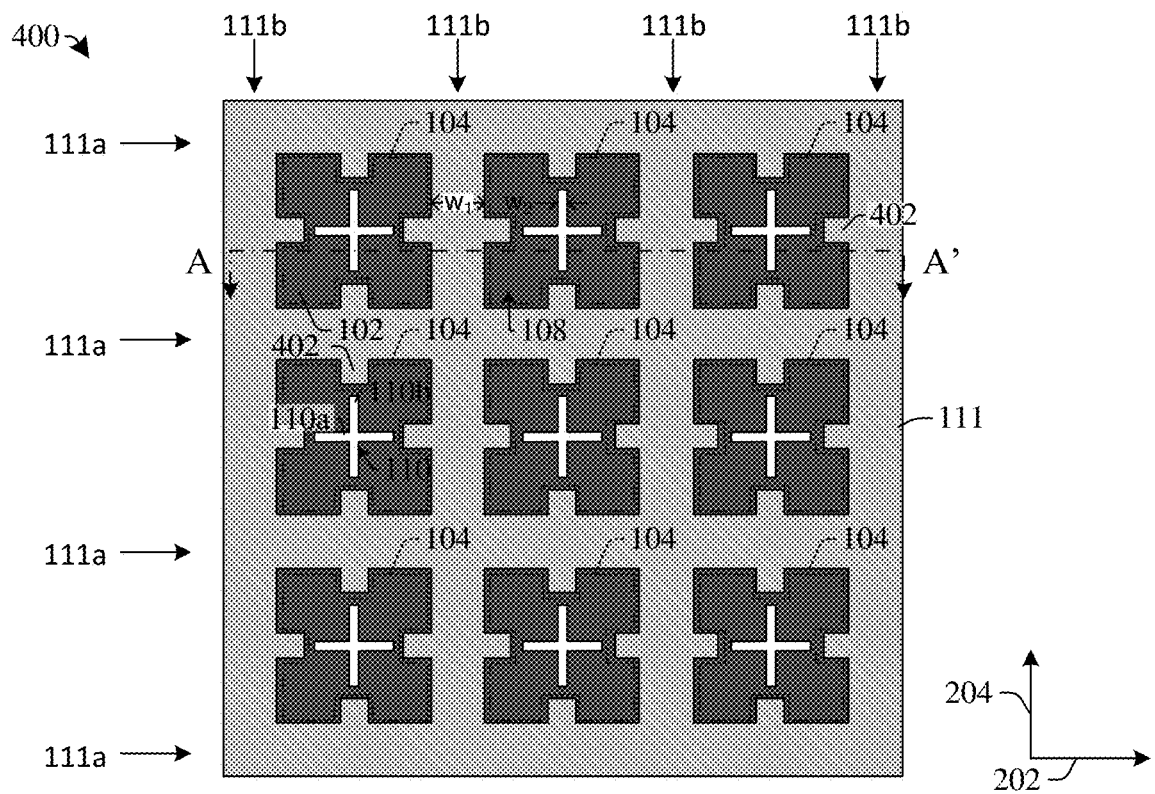

FIG. 4 illustrates yet another top view 400 of a CMOS image sensor consistent with FIG. 1 along line A-A'. In FIG. 4, the BDTI structure 111 is again disposed at boundary regions of the pixel regions, and includes a first set of BDTI segments 111a extending in a first direction and a second set of BDTI segments 111b extending in a second direction perpendicular to the first direction to laterally surround the photodiodes 104. In addition, the BDTI structure 111 includes protrusions 402 extending inwardly from an inner sidewall of the BDTI structure 111 for each pixel. Within each pixel, the PDTI structure 110 of FIG. 4 includes a first PDTI segment 110a extending in the first direction and a second PDTI segment 110b extending in the second direction (e.g., to form a "plus"-shape or "t"-shape), but other PDTI structures such as the linear PDTI structure of FIG. 2, or other PDTI structures illustrated further herein could also be inserted into each pixel. In FIG. 4, the protrusions 402 are aligned with the first PDTI segments 110a and second PDTI segments 110b of each pixel, such that each pixel includes a top protrusion, bottom protrusion, left protrusion, and right protrusion, and protrusions are aligned with one another in the first direction and second direction.

FIGS. 5, 6, 8, 8, 9 and 10 show further top views 500, 600, 700, 800, 900, and 1000, respectively, of CMOS image sensors that include a BDTI structure 111 and PDTI structure 110 made of different materials in accordance with some embodiments. Thus, the PDTI structure 110 can be made of a dielectric material, such as silicon dioxide, and the BDTI structure 111 can be made of metal or polysilicon in these embodiments.

Figure 5:
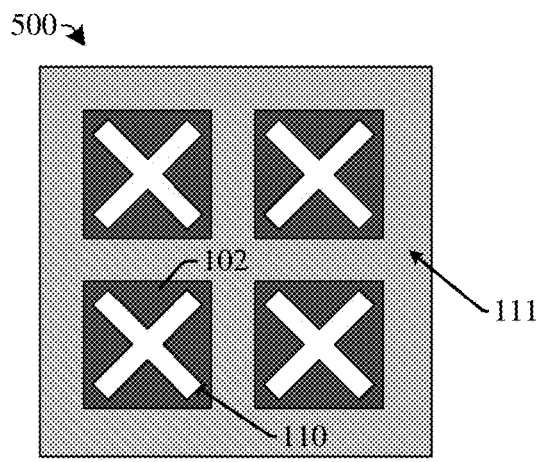
FIGS. 5-10 illustrate a plurality of top views of some additional embodiments of a CMOS image sensor.
Figure 6:
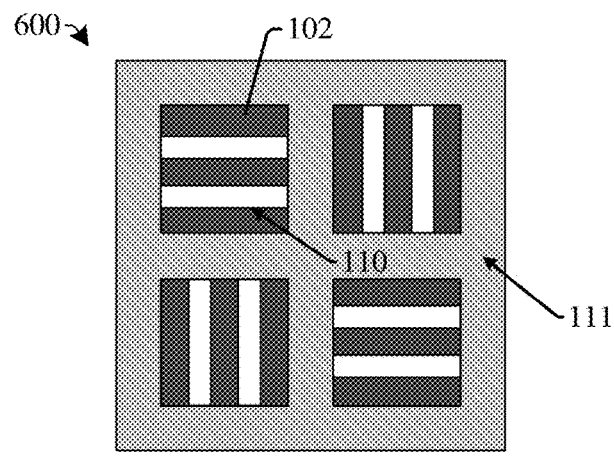
Figure 7:
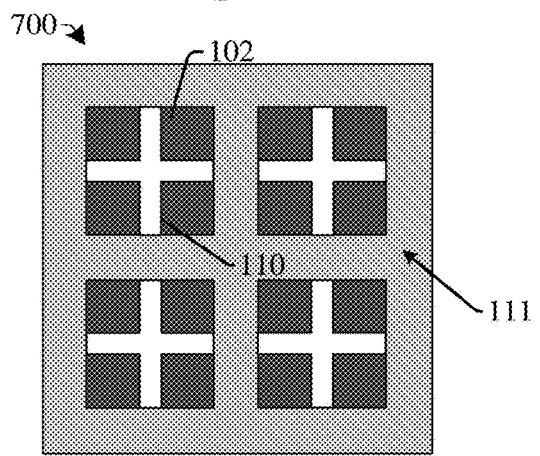
Figure 8:
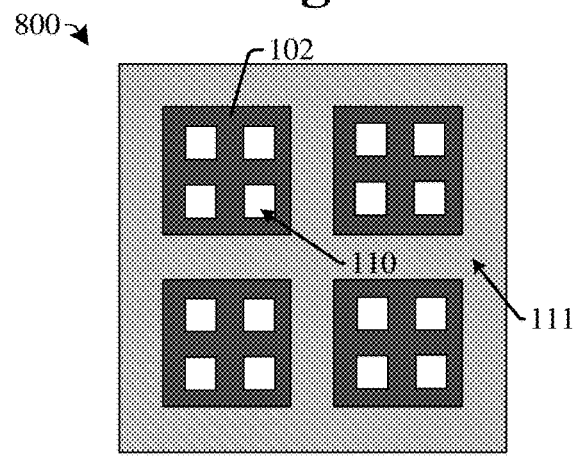
Figure 9:
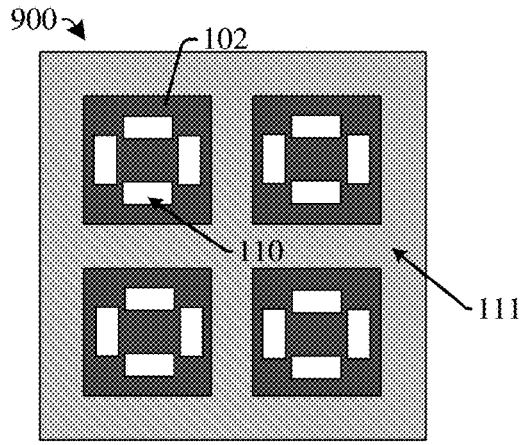
Figure 10:
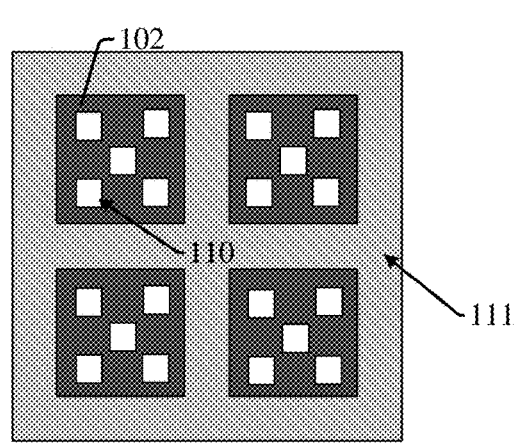
Figure 16:
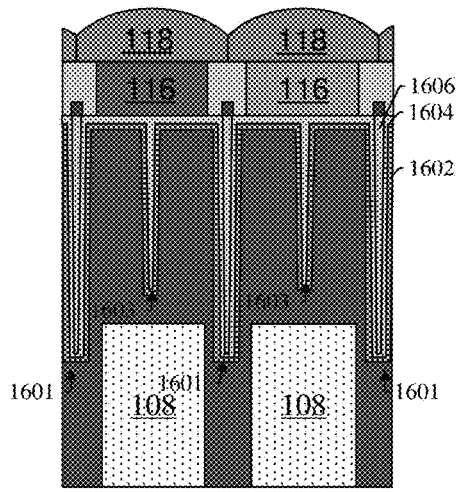
FIG. 16-19 illustrates a cross-sectional view of some additional embodiments of a CMOS image sensor including various more detailed BDTI structures and PDTI structures.

It is appreciated that FIGS. 5-10 can be considered as further examples of the patterns of the PDTI structure 110 and BDTI structure 111 in addition to what is shown in FIG. 1-4 and may be altered for other variations. Patterns shown in FIGS. 5-10 and other variations can be incorporated into the image sensor described in FIG. 1 and FIG. 2. As shown in FIG. 5 and FIG. 7, the PDTI structure 110 may comprise a first segment and a second segment that cross one other at a center region of the pixel region. Further, while in FIGS. 2-4 and FIG. 5 the outer edges of the PDTI structure 110 are spaced apart from the inner edges of the BDTI structure 111, FIG. 7 shows an example where the PDTI structure 110 has outer edges that directly contact the inner edges of the BDTI structure 111. Further still, as shown in FIG. 6 and FIGS. 8-10, the PDTI structure 110 may comprise segments that are spaced apart from one other. The segments may be symmetrical along a middle line of the pixel region. The segments may be distributed in the same pattern within each pixel (e.g. FIGS. 8-10) or may be rotated from one pixel to another pixel (e.g. FIG. 6). A center region of the substrate 102 of the pixel region may be covered by the PDTI structure (e.g. FIGS. 5, 7, 10) or may be exposed to the incident radiation (e.g. FIGS. 6, 8, 9).

FIGS. 11-15 illustrate cross-section views of CMOS image sensors that illustrate various relative depths for the PDTI structure 110 and BDTI structure 111. In each example the BDTI structure 111 has a first depth, d1, and the PDTI structure 110 has a second depth, d2. Further, in comparison to FIGS. 1-4, which illustrated examples where one micro lens covers one corresponding photodiode, the examples of FIGS. 11-15 illustrate examples where a single micro-lens covers two photodiodes (e.g., 2×1 rectangle as viewed from above) or four photodiodes (e.g., 2×2 square as viewed from above) for the array. In other cases, one micro lens could also correspond to other numbers of photodiodes, with all such embodiments contemplated as falling within the scope of the present disclosure.

FIG. 11 illustrates a CMOS image sensor 1100 where the first depth d1 is equal to the second depth, d2. Further, both the first and second depths are greater than 50% of the total thickness of the substrate 102 and less than 100% of the full thickness of the substrate 102.

FIG. 12 illustrates a CMOS image sensor 1200 where the first depth d1 is greater than the second depth d2; and a ratio of the first depth d1 to the second depth d2 may be in a range of from about 2:1 to about 6:1. Thus, in FIG. 12, the second depth is less than half of the first depth, and the first depth is more than 50% of the total thickness of the substrate 102 in some cases.

FIG. 13 illustrates a CMOS image sensor 1300 where the first depth d1 is greater than the second depth d2; and a ratio of the first depth d1 to the second depth d2 may be in a range of from about 6:5 to about 2:1. Thus, in FIG. 13, the second depth is more than half of the first depth, and the first depth is more than 50% of the total thickness of the substrate 102 in some cases.

FIG. 14 illustrates a CMOS image sensor 1400 where the first depth d1 is equal to the full thickness of the substrate, and the second depth is less than the first depth. In some cases, the second depth is less than 25% of the full thickness of the substrate 102, while in other cases the second depth is between 25% and 50% of the full thickness of the substrate 102, and in still other cases the second depth is more than 50% of the full thickness of the substrate 102.

FIG. 15 illustrates a CMOS image sensor 1500 where the first depth d1 and the second depth d2 are each equal to the full thickness of the substrate 102. This approach may provide the best isolation between pixels, but also may take additional processing time due to the longer etch required to etch through the full thickness of the substrate 102.

FIGS. 16-19 illustrate more detailed examples of cross-sectional views of CMOS image sensors in accordance with various embodiments. In embodiment 1600 of FIG. 16, a continuous high-k dielectric layer 1602 lines inner sidewalls of a BDTI trench 1601 and inner sidewalls of a PDTI trench 1603. An oxide layer 1604 fills a remainder of the PDTI trench to form the PDTI structure, and lines inner sidewalls of the high-k dielectric layer 1602 in the BDTI trench 1601. A metal or polysilicon layer 1606, such as aluminum, fills a remainder of the BDTI trench 1601 to form the BDTI structure. An upper surface of the metal or polysilicon layer 1606 is flush, level, or planar with an upper surface of the oxide layer 1604.

Figure 17:
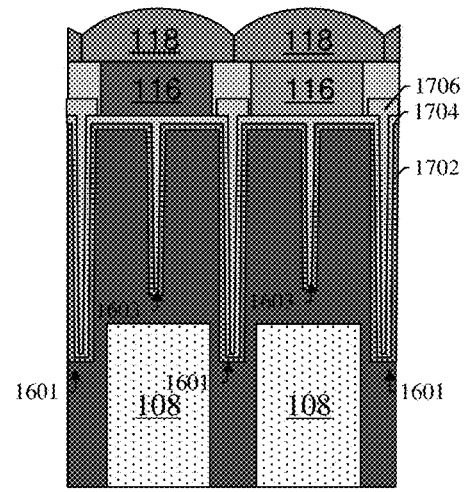

FIG. 17 illustrates another embodiment 1700 where a continuous high-k dielectric layer 1702 lines inner sidewalls of a BDTI trench 1601 and inner sidewalls of a PDTI trench 1603. An oxide layer 1704 fills a remainder of the PDTI trench 1603 to form the PDTI structure, and lines inner sidewalls of the high-k dielectric layer 1702 in the BDTI trench 1601. A metal or polysilicon layer 1706, such as aluminum, fills a remainder of the BDTI trench 1601 to form the BDTI structure. In contrast to FIG. 16, where an upper surface of the metal or polysilicon layer 1606 is flush, level, or planar with an upper surface of the oxide layer 1604, in FIG. 17 the metal layer 1706 has an upper surface that extends above the upper surface of the oxide layer 1704 and resides at a height within the color filters 116.

Figure 18:
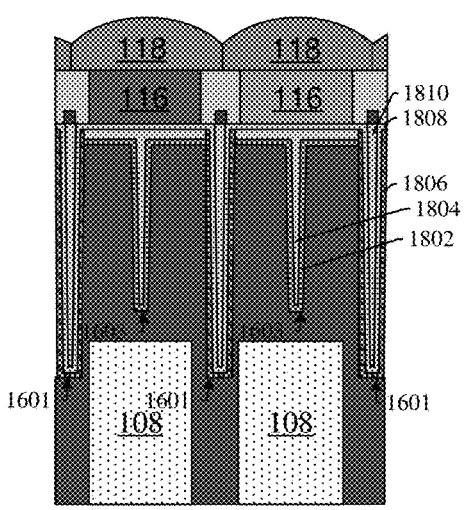

FIG. 18 illustrates an embodiment 1800 where a first high-k dielectric layer 1802 lines inner sidewalls of a PDTI trench 1603 and extends over the upper surface of the substrate in the pixel regions. A first oxide layer 1804 fills a remainder of the PDTI trench 1603 to form the PDTI structure, and extends over the upper surface of the substrate, but stops at outer sidewalls of a second high-k dielectric layer 1806, which is confined to inner sidewalls of a BDTI trench 1601 and can have the same composition or different composition from the first high-k dielectric layer 1802. A second oxide layer 1808, which can have the same composition as the first oxide layer 1804 and which can be silicon dioxide for example, or which can have a different composition from the first oxide layer 1804, lines inner sidewalls of the second high-k dielectric layer 1806 in the BDTI trench 1601 and extends over the first oxide layer 1804 over the upper surface of the substrate in the pixel regions. A metal or polysilicon layer 1810, such as aluminum, fills a remainder of the BDTI trench to form the BDTI structure. An upper surface of the metal layer is flush, level, or planar with an upper surface of the second oxide layer in some embodiments.

Figure 19:
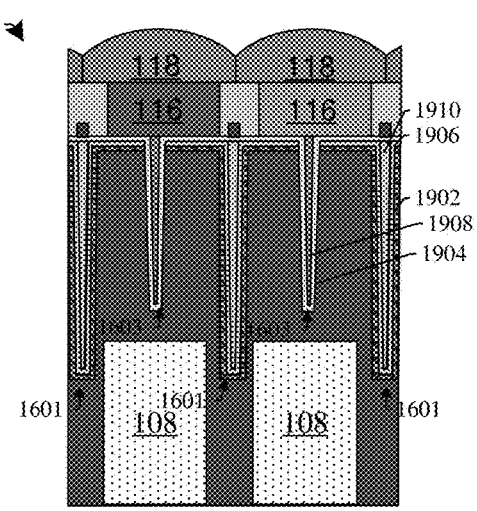

FIG. 19 illustrates an embodiment 1900 where a first high-k dielectric layer 1902 lines inner sidewalls of a BDTI trench 1601 and extends over the upper surface of the substrate. A second high-k dielectric layer 1904 lines inner sidewalls of the PDTI trench 1603, and extends upwards past the first high-k dielectric layer 1902 and continues over the upper surface of the substrate. A first oxide layer 1906 lines inner sidewalls of the first high-k dielectric layer 1902 in the BDTI trench 1601 and extends over the first high-k dielectric layer 1902 over the upper surface of the substrate to terminate at outer sidewalls of the second high-k dielectric layer 1904. A second oxide layer 1908, which can have the same composition as the first oxide layer 1906 and which can be silicon dioxide for example or which can have a different composition from the first oxide layer 1906, fills a remainder of the PDTI trench 1603 to form the PDTI structure. A metal or polysilicon layer 1910, such as aluminum, fills a remainder of the BDTI trench 1601 to form the BDTI structure. An upper surface of the metal or polysilicon layer 1910 is flush, level, or planar with an upper surface of the first oxide layer 1906 in some embodiments.

Figure 20:
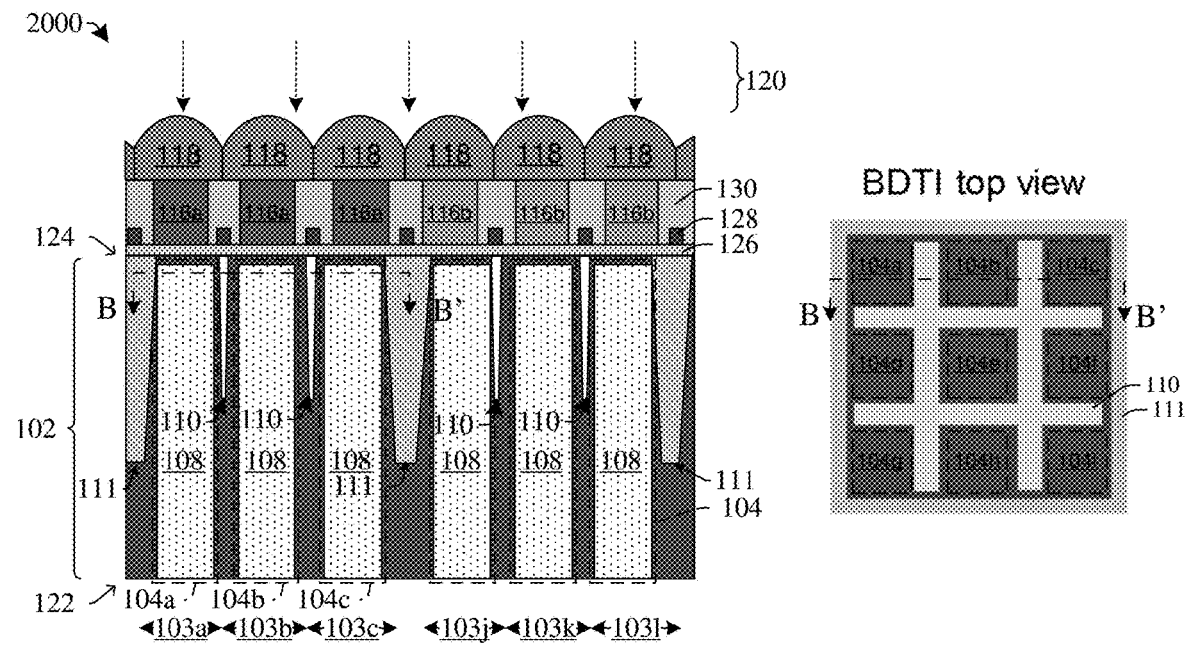
FIGS. 20-21 each illustrate a cross-sectional view and a corresponding top view of some additional embodiments of a CMOS image sensor.

FIG. 20 illustrates another embodiment of a CMOS image sensor 2000, where the left portion of FIG. 20 illustrates a cross-sectional view and the right portion illustrates a corresponding top view along sectional line B-B'. In this embodiment, the BDTI structure 111 is a continuous ring comprising metal or polysilicon that laterally encloses multiple pixels. The PDTI structure is a grid-like structure comprising a dielectric material. The PDTI structure including a first set of segments extending in parallel with one another in a first direction and spaced apart according to a first pitch between centerlines of the first segments, and a second set of segments extending in parallel with one another in a second direction and spaced apart according to a second pitch between centerlines of the first segments. The first direction is perpendicular to the second direction, and in some embodiments, the first pitch is equal to the second pitch. Outer edges of the microlenses 1108 are aligned over outer edges of the respective pixels, and are aligned over the PDTI structures and/or BDTI structures in some embodiments.

Notably, this arrangement results in select pixels (e.g., central pixel 104e) being surrounded on all four sides by the PDTI structure, while some edge pixels (e.g., 104b, 104d, 104f, 104h) are surrounded on three sides by the PDTI structure and the remaining side by the BDTI structure, and corner pixels (e.g., 104a, 104c, 104g, and 104i) are surrounded on two sides by the PDTI structure and the other two sides by the BDTI structure. Thus, some of the pixels can receive better cross-talk protection than others according to this predetermined configuration, where the extent of cross-talk protection for a pixel corresponds to the number of edges that are PDTI segments versus BDTI segments for that pixel. In some embodiments, all color filters over a given BDTI structure are of the same color. So for example, in FIG. 20, the color filters 116a can be configured to allow passage of a first wavelength of light (e.g., blue light) while generally removing other wavelengths of light from passing through; while the color filters 116b can be configured to allow passage of a second wavelength of light (e.g., red light) while generally removing other wavelengths of light from passing through.

Figure 21:
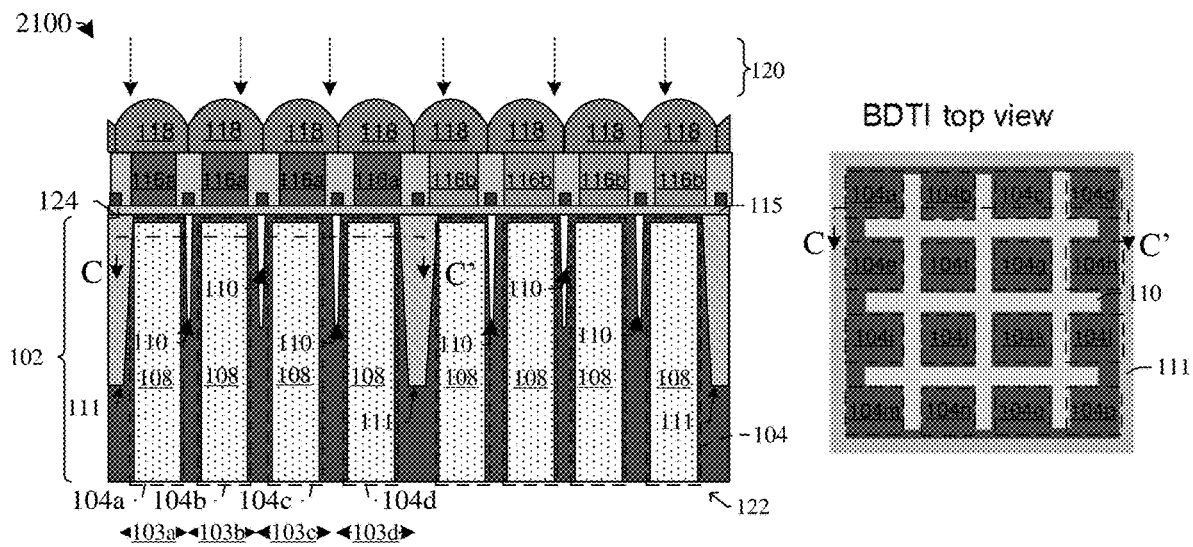
Figures 22, 23:
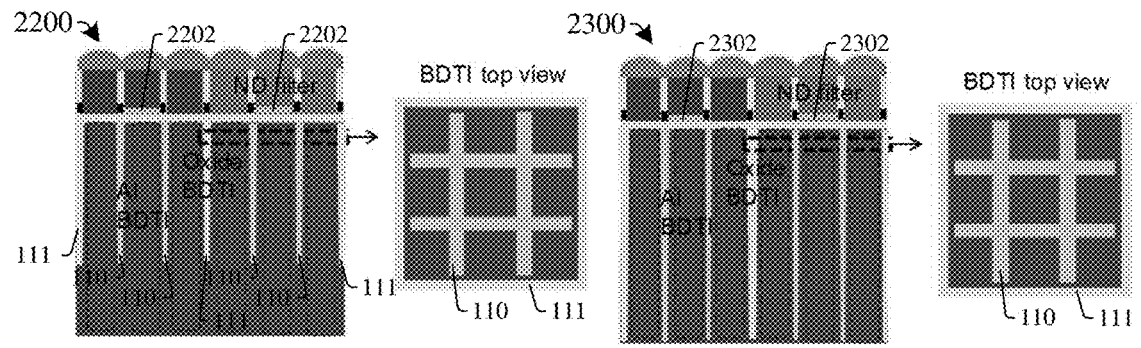
FIGS. 22-29 each illustrate a cross-sectional view and a corresponding top view of some additional embodiments of a CMOS image sensor.
Figures 24, 25:
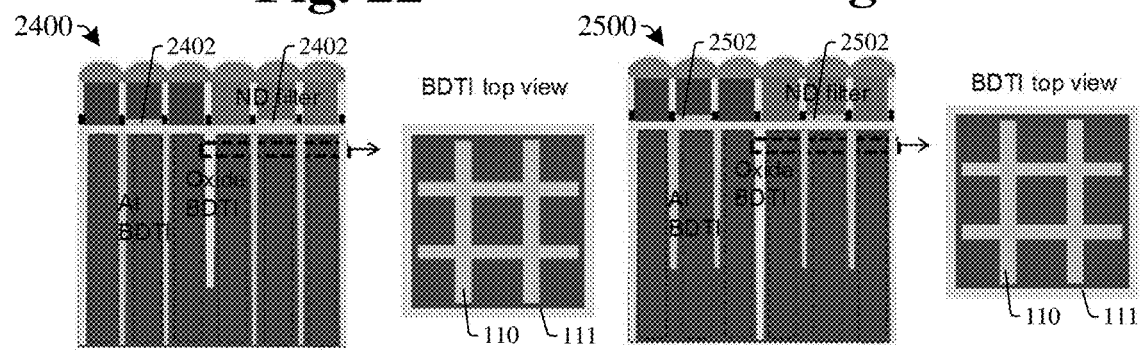
Figures 26, 27:
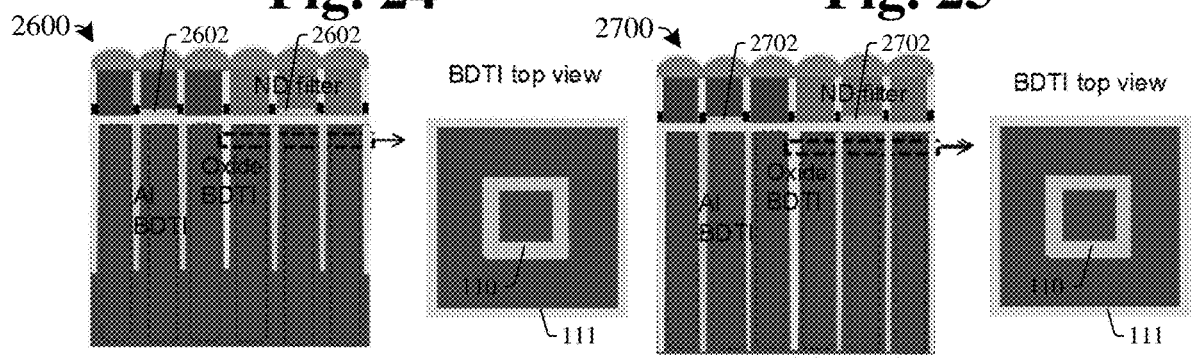
Figures 28, 29:
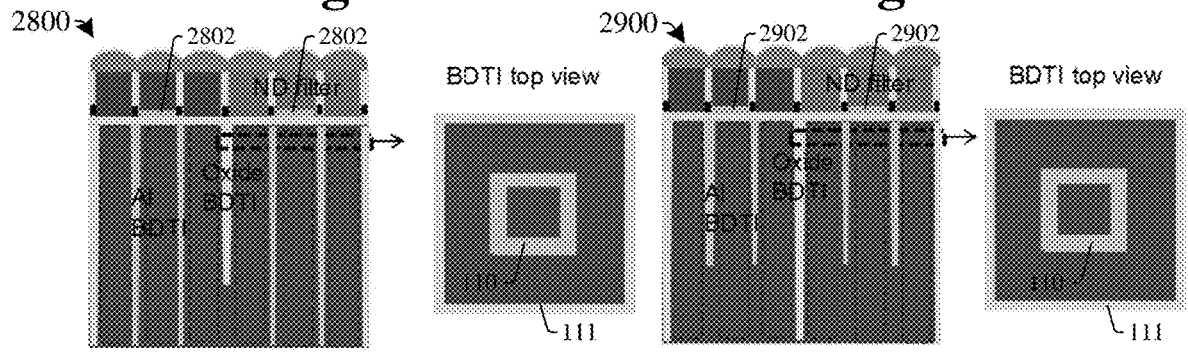

FIG. 21 illustrates a CMOS image sensor 2100 that is somewhat similar to FIG. 20, except as shown in the top view of FIG. 21, the image sensor 2100 has sixteen pixels (104a-104p) that are surrounded by each BDTI structure 111, while image sensor 2000 of FIG. 20 had only nine pixels (104a-104i) surrounded by each BDTI structure 111.

FIGS. 22, 23, 24, 25, 26, 27, 28 and 29 illustrate additional embodiments 2200, 2300, 2400, 2500, 2600, 2700, 2800, and 2900, respectively, of CMOS image sensors that include a BDTI structure and PDTI structure made of different materials in accordance with some embodiments. FIG. 22-29 each include a top view and a corresponding cross-sectional view as indicated. In each of these figures, some of the pixels have an outer perimeter that is fully surrounded by a metal BDTI, while other pixels have an outer perimeter that is only partially surrounded by the metal BDTI structure and a remainder of the outer perimeter is surrounded by an oxide BDTI structure. Further, in these embodiments, the BDTI structure 111 comprises a dielectric material (and can for example be made of silicon dioxide or a high-k dielectric), while the PDTI structure 110 comprises a metal or polysilicon. Although FIGS. 22-29 illustrate a small number of patterns for the PDTI structure 110, it will be appreciated that the other patterns described and/or illustrated herein for the PDTI structures can also be made of metal or polysilicon, and other patterns described and/or illustrated herein for the BDTI structures can also be made of dielectric material.

Further, the embodiments of FIGS. 22-29 each also depict a neutral density (ND) filter (2202, 2302, 2402, 2502, 2602, 2702, 2802, and 2902, respectively) arranged over at least one of the pixels within the BDTI structure 111. For example, in FIGS. 22, each of the two illustrated BDTI structures has a central pixel that includes an ND filter 2202 over top of the corresponding photodiode, while the other pixels within the BDTI structures do not include the ND filter overtop of their corresponding photodiodes. In some embodiments, the ND filter comprises or is made of Ti, TiN, W, or a thin film made of metal. Compared to the color filters, which allow only a predetermined wavelength to pass through while significantly attenuating other wavelengths of light; the ND filters reduce the intensity of all wavelengths, or colors, of light equally. Thus, the central pixel within a BDTI structure includes a color filter and ND filter, while the other pixels within the BDTI structure merely include a color filter.

Figure 30:
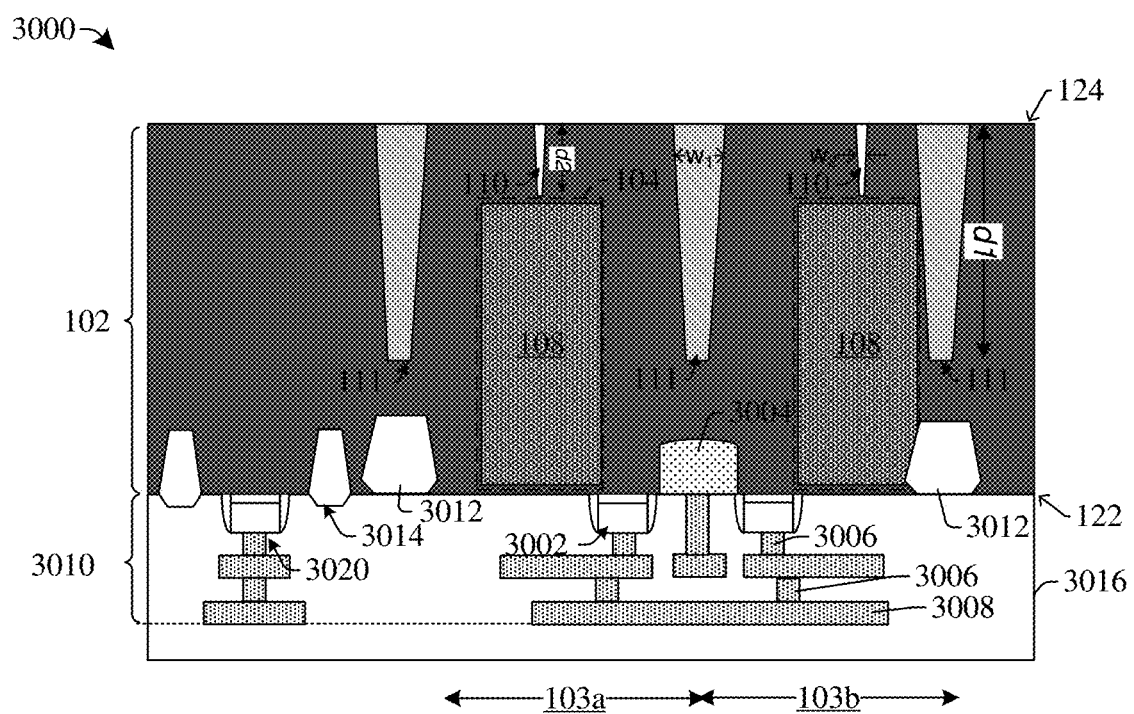
FIG. 30 illustrates a cross-sectional view of some embodiments of a CMOS image sensor with a back-end-of-line (BEOL) metallization stack.

FIG. 30 illustrates a cross-sectional view 3000 of some additional embodiments of an integrated chip comprising an image sensor having a pixel deep trench isolation (PDTI) structure. Besides similar features shown and described above, in some embodiments, a floating diffusion well 3004 is disposed between the adjacent pixel regions 103a, 103b from the front-side 122 of the substrate 102 to a position within the substrate 102. A transfer gate 3002 is arranged on the front-side 122 of the substrate 102 at a position laterally between the photodiode 104 and the floating diffusion well 3004. During the operation, the transfer gate 3002 controls charge transfer from the photodiode 104 to the floating diffusion well 3004. If the charge level is sufficiently high within the floating diffusion well 3004, a source follower transistor (not shown) is activated and charges are selectively output according to the operation of a row select transistor (not shown) used for addressing. A reset transistor (not shown) can be used to reset the photodiode 104 between exposure periods. In some embodiments, a shallow trench isolation (STI) structure 3012 is disposed at boundary regions of the pixel regions 103a, 103b from the front-side 122 of the substrate 102 to a position within the substrate 102 and surrounding the photodiode 104. The STI structure 3012 and the BDTI structure 111 may be vertically aligned (e.g. sharing a common center line).

In some embodiments, a back-end-of-the-line (BEOL) metallization stack 3010 is arranged on the front-side 122 of the substrate 102. The BEOL metallization stack 3010 comprises a plurality of metal interconnect layers arranged within one or more inter-level dielectric (ILD) layers 3016. The ILD layers 3016 may comprise one or more of a low-k dielectric layer (i.e., a dielectric with a dielectric constant less than about 3.9), an ultra low-k dielectric layer, or an oxide (e.g., silicon oxide). A logic gate device 3020 may be disposed on the same integrated chip of the image sensor and isolated by a logic STI structure 3014. The logic STI structure 3014 may have same or different dimensions of the STI structure 3012. Conductive contacts 3006 are arranged within the ILD layers 3106. The conductive contacts 3006 extend from the transfer gate 3002 and the floating diffusion well 3004 to one or more metal wire layers 3008. In various embodiments, the conductive contacts 3006 may comprise a conductive metal such as copper or tungsten, for example.

Turning now to FIGS. 31-60, one can see various embodiments of manufacturing flows for forming a CMOS image sensor having a boundary deep trench isolation (BDTI) structure and a pixel deep trench isolation (PDTI) structure. More particularly, FIGS. 31-35 illustrate some embodiments of cross-sectional views showing a first manufacturing flow, FIGS. 36-40 illustrate some embodiments of cross-sectional views showing a second manufacturing flow, FIGS. 41-45 illustrate some embodiments of cross-sectional views showing a third manufacturing flow, FIGS. 46-52 illustrate some embodiments of cross-sectional views showing a fourth manufacturing flow, FIGS. 53-59 illustrate some embodiments of cross-sectional views showing a fifth manufacturing flow, and FIG. 60 illustrates some embodiments of flowchart showing a manufacturing flow. Although these methods and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Turning now to FIGS. 31-35, one can see a series of cross-sectional views that collectively depict a first method for forming a CMOS image sensor having a boundary deep trench isolation (BDTI) structure and a pixel deep trench isolation (PDTI) structure. As shown in cross-sectional view

Figure 31:
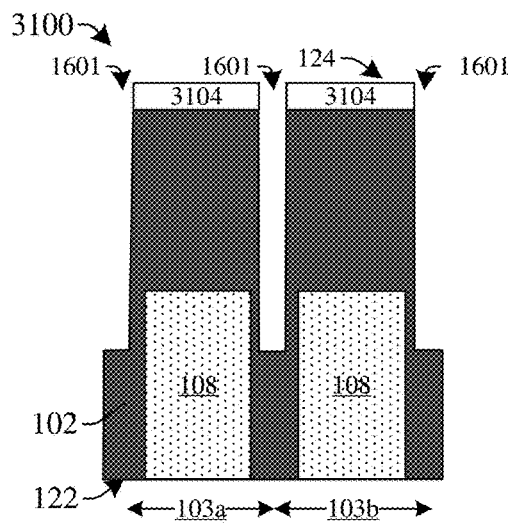
FIGS. 31-35 depict a series of cross-sectional views that collectively depict a first method of forming a CMOS image sensor in accordance with some embodiments.

3100 of FIG. 31, a substrate 102 is provided. In various embodiments, the substrate 102 may comprise any type of semiconductor body (e.g., silicon/CMOS bulk, SiGe, etc.) such as a semiconductor wafer or one or more die on a wafer, as well as any other type of semiconductor and/or epitaxial layers formed thereon and/or otherwise associated therewith. The substrate 102 may be prepared including a blanket implant or a grading epitaxial growth process with a first doping type (e.g. p-type). A photodiode is formed within the substrate 102, by forming a doped layer 108 having a second doping type (e.g., n-type dopant (e.g., phosphorous)) within a front-side 122 of the substrate 102.

Though not shown in FIG. 31, a BEOL metallization stack comprising a plurality of metal interconnect layers arranged within an ILD layer (e.g. referring to FIG. 30 for the BEOL metallization stack 3010) can be formed over the front-side 122 of the substrate 102. In some embodiments, the BEOL metallization stack may be formed by forming the ILD layer, which comprises one or more layers of ILD material, over the front-side 122 of the substrate 102. The ILD layer is subsequently etched to form via holes and/or metal trenches. The via holes and/or metal trenches are then filled with a conductive material to form the plurality of metal interconnect layers. In some embodiments, the ILD layer may be deposited by a physical vapor deposition technique (e.g., PVD, CVD, etc.). The plurality of metal interconnect layers may be formed using a deposition process and/or a plating process (e.g., electroplating, electroless plating, etc.). In various embodiments, the plurality of metal interconnect layers may comprise tungsten, copper, or aluminum-copper, for example. The ILD layer can be then bonded to a handle substrate (not shown). In some embodiments, the bonding process may use an intermediate bonding oxide layer arranged between the ILD layer and the handle substrate. In some embodiments, the bonding process may comprise a fusion bonding process.

As shown in cross-sectional view 3100 of FIG. 31, the substrate 102 is flipped over for further processing on a back-side 124 that is opposite to the front-side 122. The substrate 102 is selectively etched to form a BDTI trench 1601 within the back-side 124 of the substrate 102 between adjacent pixel regions 103a, 103b. In some embodiments, the substrate 102 may be etched by forming a masking layer 3104 onto the back-side 124 of the substrate 102. The substrate 102 is then exposed to an etchant in regions not covered by the masking layer 3104. The etchant etches the substrate 102 to form the BDTI trench 1601 extending to the substrate 102 to a depth lower than the top surface of the doped layer 108. In some embodiments, the BDTI trench 1601 may stop at a depth of the substrate 102 above a bottom surface of the doped layer 108. In some alternative embodiments not shown in FIG. 8, the BDTI trench 1601 may reach a depth of the substrate 102 lower than a bottom surface of the doped layer 108.

Figure 32:
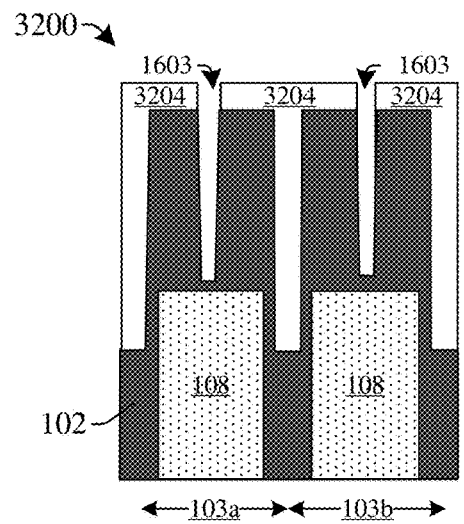

As shown in cross-sectional view 3200 of FIG. 32, a second etch process is performed to form a PDTI trench 1603 within the back-side 124 of the substrate 102 within individual pixel region 103a, 103b. In some embodiments, the substrate 102 may be etched by forming a masking layer 3204 onto the back-side 124 of the substrate 102. The substrate 102 is then exposed to an etchant in regions not covered by the masking layer 3204. The etchant etches the substrate 102 to form the PDTI trench 1603 extending to the substrate 102 and overlying the doped layer 108. In some embodiments, the PDTI trench 1603 may stop at a depth of the substrate 102 above the doped layer 108. In some alternative embodiments not shown in FIG. 32, the PDTI trench 1603 may reach a depth of the substrate 102 lower than a top surface of the doped layer 108.

In various embodiments, the masking layer 3104 of FIG. 31 and the masking layer 3204 of FIG. 32 may comprise photoresist or a nitride (e.g., SiN) patterned using a photolithography process. In various embodiments, the etchant of FIG. 31 and FIG. 32 may comprise a dry etchant have an etching chemistry comprising a fluorine species (e.g., $CF_4$, $CHF_3$, $C_4F_8$, etc.) or a wet etchant (e.g., hydrofluoric acid (HF) or Tetramethylammonium hydroxide (TMAH)). The substrate 102 may be thinned to reduce a thickness of the substrate 102 before forming the PDTI trench 1603 and allow for radiation to pass through the back-side 124 of the substrate 102 to the photodiode 104. In some embodiments, the substrate 102 may be thinned by etching the back-side 124 of the semiconductor substrate. In other embodiments, the substrate 102 may be thinned by mechanical grinding the back-side 124 of the semiconductor substrate. The order to form the BDTI trench 1601 and the PDTI trench 1603 is exchangeable, i.e., the BDTI trench 1601 may be formed prior to or after forming the PDTI trench 1603.

Figure 33:
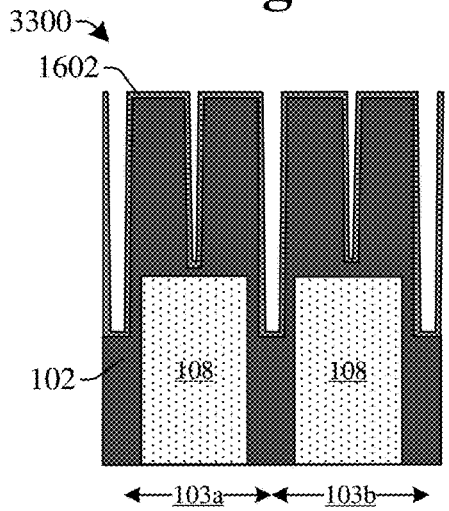

As shown in cross-sectional view 3300 of FIG. 33, the PDTI trench 1603 and the BDTI trench 1601 are filled with dielectric material. In some embodiments, an anti-reflective coating (ARC) layer (not shown) is conformally deposited along sidewalls of the PDTI trench 1603 and the BDTI trench 1601, and a high-k dielectric layer 1602 is conformally deposited along inner sidewalls of the PDTI trench 1603 and the BDTI trench 1601 (and/or along inner sidewalls of ARC layer, if present). The high-k dielectric layer 1602 may be formed by deposition techniques and may comprise aluminum oxide (AlO), hafnium oxide (HfO), tantalum oxide (TaO) or other dielectric materials having a dielectric constant greater than that of silicon oxide.

Figure 34:
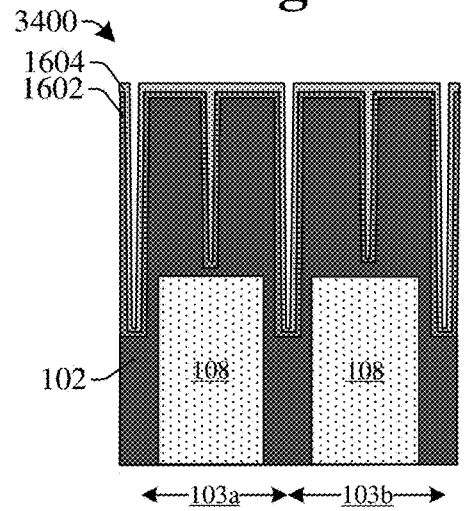

As shown in cross-sectional view 3400 of FIG. 34, an oxide layer 1604 is formed on the high-k dielectric layer 1602 and fills a reminder of the PDTI trenches, but only partially fills the BDTI trenches. In some embodiments, the oxide layer 1604 and the high-k dielectric layer 1602 may extend over the back-side 124 of the substrate 102 between the PDTI trench 1603 and the BDTI trench 1601.

Figure 35:
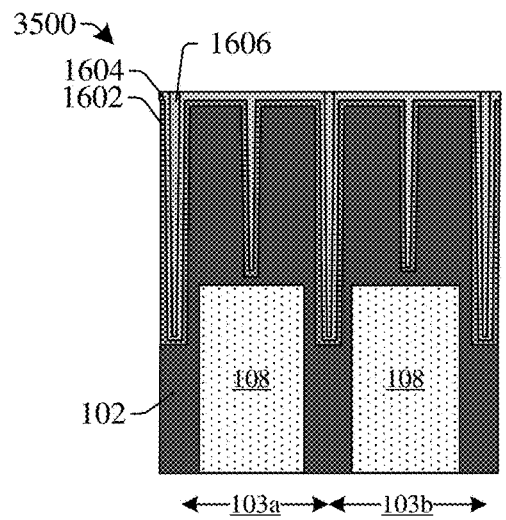

As shown in cross-sectional view 3500 of FIG. 35, a metal or polysilicon layer 1606 is formed to fill a remainder of the BDTI trench 1601. In some embodiments, a planarization process is performed after forming the metal or polysilicon layer 1606 to form a planar surface that extends along an upper surface of the oxide layer 1604 and metal or polysilicon layer 1606. A plurality of color filters and microlens structures can be subsequently formed over the back-side 124 of the substrate 102 to provide the structure previously illustrated in FIG. 16.

Turning now to FIGS. 36-40, one can see a series of cross-sectional views that collectively depict a second method for forming a CMOS image sensor having a boundary deep trench isolation (BDTI) structure and a pixel deep trench isolation (PDTI) structure.

Figure 36:
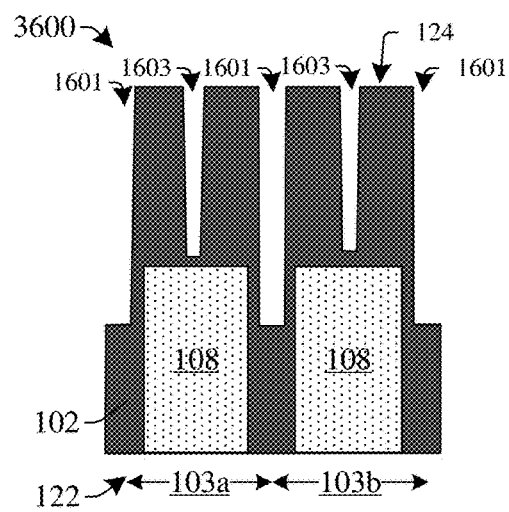
FIGS. 36-40 depict a series of cross-sectional views that collectively depict a second method of forming a CMOS image sensor in accordance with some embodiments.

As shown in cross-sectional view 3600 of FIG. 36, a substrate 102 is provided. A photodiode is formed within the substrate 102, by forming a doped layer 108 having a second doping type (e.g., n-type dopant (e.g., phosphorous)) within a front-side 122 of the substrate 102. Though not shown in FIG. 36, a BEOL metallization stack comprising a plurality of metal interconnect layers arranged within an ILD layer (e.g. referring to FIG. 30 for the BEOL metallization stack 3010) can be formed over the front-side 122 of the substrate 102. After the BEOL metallization stack is formed, the substrate 102 is flipped over for further processing on a back-side 124 that is opposite to the front-side 122. The substrate 102 is selectively etched to form a BDTI trench 1601 within the back-side 124 of the substrate 102 between adjacent pixel regions 103a, 103b; and is selectively etched to form a PDTI trench 1603 within the back-side 124 of the substrate 102 within individual pixel region 103a, 103b (see e.g., previous FIGS. 31-32 and corresponding description). The order to form the BDTI trench 1601 and the PDTI trench 1603 is exchangeable, i.e., the BDTI trench 1601 may be formed prior to or after forming the PDTI trench 1603.

Figure 37:
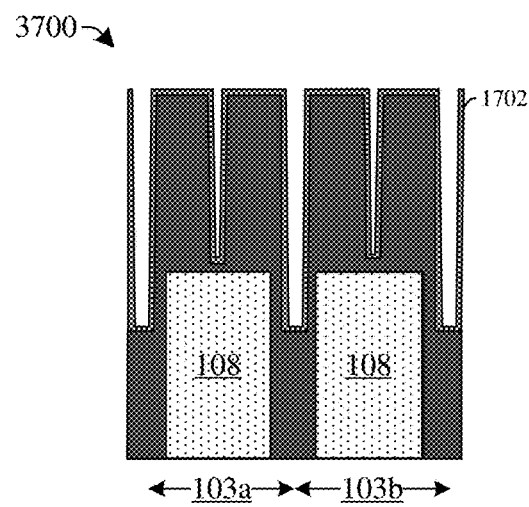

As shown in cross-sectional view 3700 of FIG. 37, the PDTI trench 1603 and the BDTI trench 1601 are partially filled with dielectric material. In some embodiments, an anti-reflective coating (ARC) layer (not shown) is conformally deposited along sidewalls of the PDTI trench 1603 and the BDTI trench 1601, and a high-k dielectric layer 1702 is conformally deposited along inner sidewalls of the PDTI trench 1603 and the BDTI trench 1601 (and/or along inner sidewalls of ARC layer, if present). The high-k dielectric layer 1702 may be formed by deposition techniques and may comprise aluminum oxide (AlO), hafnium oxide (HfO), tantalum oxide (TaO) or other dielectric materials having a dielectric constant greater than that of silicon oxide.

Figure 38:
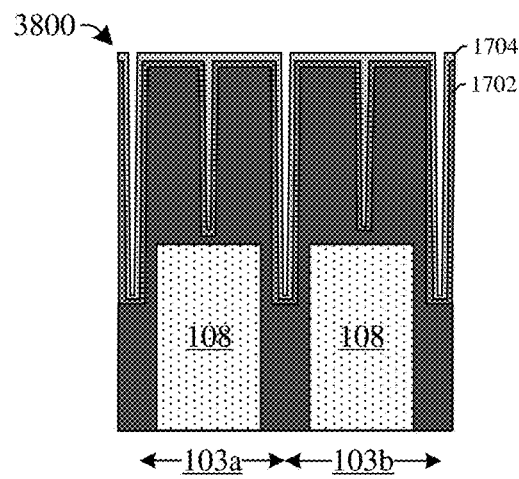

As shown in cross-sectional view 3800 of FIG. 38, an oxide layer 1704 is formed on the high-k dielectric layer 1702 and fills a reminder of the PDTI trenches, but only partially fills the BDTI trenches. In some embodiments, the oxide layer 1704 and the high-k dielectric layer 1702 may extend over the back-side 124 of the substrate 102 between the PDTI trench 1603 and the BDTI trench 1601. In some embodiments, the high-k dielectric layer 1702, the oxide layer 1704 may be deposited using a physical vapor deposition technique, an atomic layer deposition technique, or a chemical vapor deposition technique.

Figure 39:
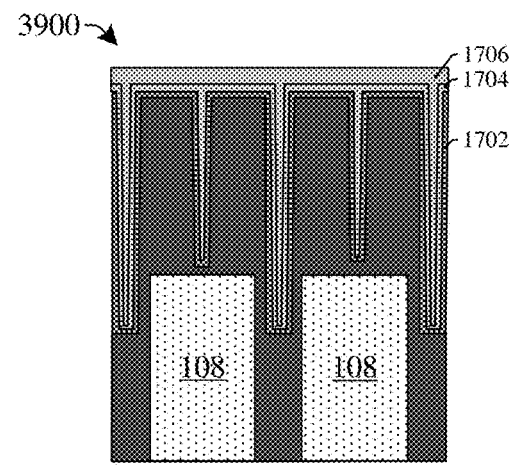

As shown in cross-sectional view 3900 of FIG. 39, a metal or polysilicon layer 1706 is formed to fill a remainder of the BDTI trench 1601. In some embodiments, a planarization process is performed after forming the metal or polysilicon layer 1706 to form a planar surface that extends along an upper surface of the oxide layer 1704 and metal or polysilicon layer 1706.

Figure 40:
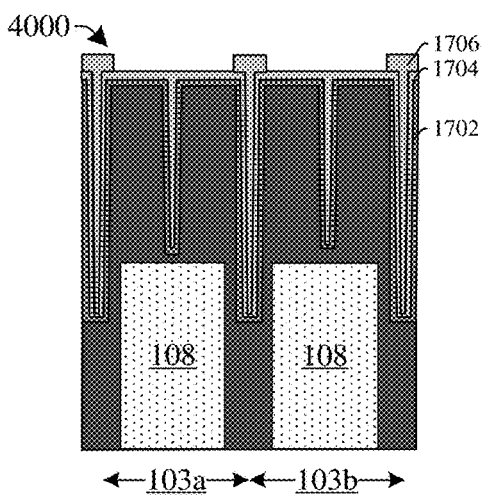

As shown in cross-sectional view 4000 of FIG. 40, a photolithography mask is formed over the metal or polysilicon layer 1706, and an etch is carried out to etch the metal or polysilicon layer 1706 to provide the structure of FIG. 40. Although not illustrated in FIG. 40, a plurality of color filters and microlens structures can be subsequently formed over the back-side 124 of the substrate 102 to provide the structure previously illustrated in FIG. 17.

Turning now to FIGS. 41-45, one can see a series of cross-sectional views that collectively depict a third method for forming a CMOS image sensor having a boundary deep trench isolation (BDTI) structure and a pixel deep trench isolation (PDTI) structure. As shown in cross-sectional view 4100 of FIG. 41, a substrate 102 is provided. A photodiode is formed within the substrate 102, by forming a doped layer 108 having a second doping type (e.g., n-type dopant (e.g., phosphorous)) within a front-side 122 of the substrate 102. Though not shown in FIG. 41, a BEOL metallization stack comprising a plurality of metal interconnect layers arranged within an ILD layer (e.g. referring to FIG. 30 for the BEOL metallization stack 3010) can be formed over the front-side 122 of the substrate 102.

Figure 41:
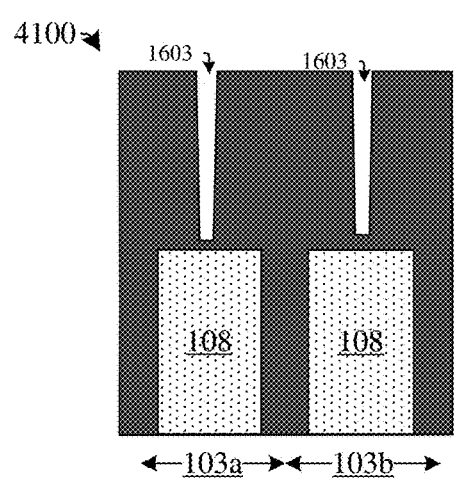
FIGS. 41-45 depict a series of cross-sectional views that collectively depict a third method of forming a CMOS image sensor in accordance with some embodiments.

As shown in cross-sectional view 4100 of FIG. 41, the substrate 102 is flipped over for further processing on a back-side 124 that is opposite to the front-side 122. The substrate 102 is selectively etched to form a PDTI trench 1603 within the back-side 124 of the substrate 102 within adjacent pixel regions 103a, 103b.

Figure 42:
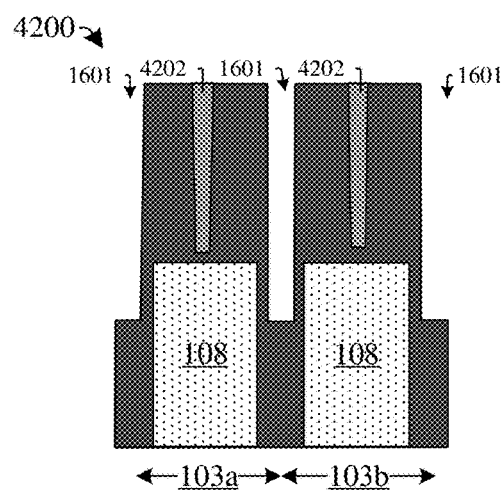

As shown in cross-sectional view 4200 of FIG. 42, a photoresist plug 4202 is then formed in the PDTI trench 1603, and the substrate is selectively etched to form a BDTI trench 1601 in the substrate.

Figure 43:
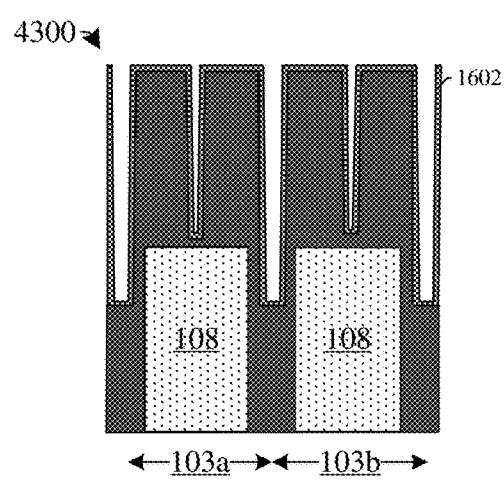

As shown in cross-sectional view 4300 of FIG. 43, the PDTI trench 1603 and the BDTI trench 1601 are partially filled with dielectric material. In some embodiments, an anti-reflective coating (ARC) layer (not shown) is conformally deposited along sidewalls of the PDTI trench 1603 and the BDTI trench 1601, and a high-k dielectric layer 1602 is conformally deposited along inner sidewalls of the PDTI trench 1603 and the BDTI trench 1601 (and/or along inner sidewalls of ARC layer, if present). The high-k dielectric layer 1602 may be formed by deposition techniques and may comprise aluminum oxide (AlO), hafnium oxide (HfO), tantalum oxide (TaO) or other dielectric materials having a dielectric constant greater than that of silicon oxide.

Figure 44:
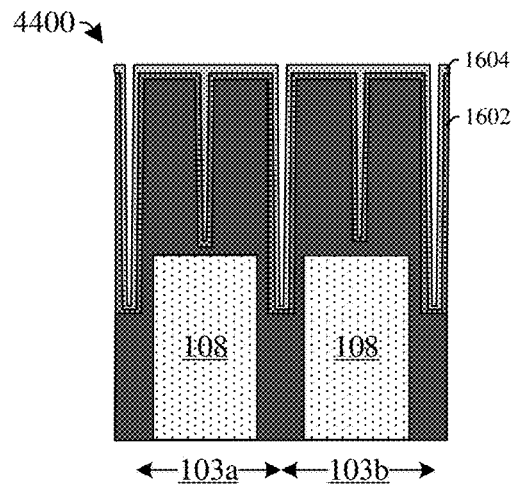

As shown in cross-sectional view 4400 of FIG. 44, an oxide layer 1604 is formed on the high-k dielectric layer 1602 and fills a reminder of the PDTI trenches, but only partially fills the BDTI trenches. In some embodiments, the oxide layer 1604 and the high-k dielectric layer 1602 may extend over the back-side 124 of the substrate 102 between the PDTI trench 1603 and the BDTI trench 1601. In some embodiments, the high-k dielectric layer 1602, the oxide layer 1604 may be deposited using a physical vapor deposition technique, an atomic layer deposition technique, or a chemical vapor deposition technique.

Figure 45:
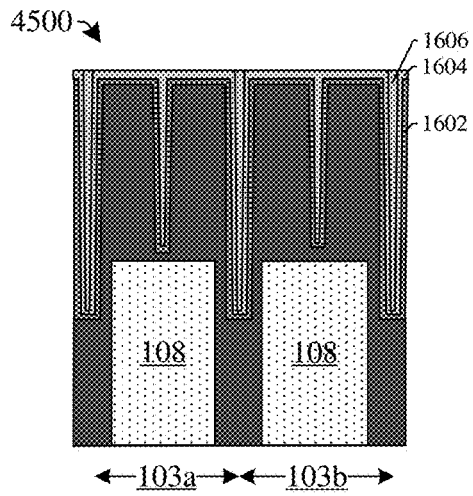
Figure 46:
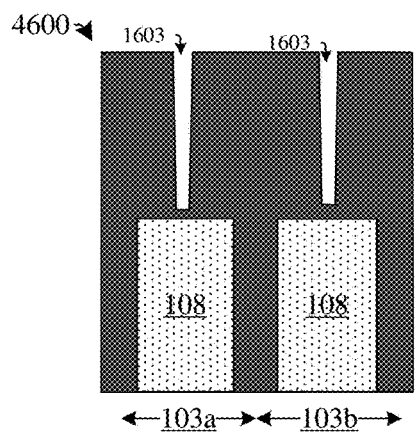
FIGS. 46-52 depict a series of cross-sectional views that collectively depict a fourth method of forming a CMOS image sensor in accordance with some embodiments.

As shown in cross-sectional view 4500 of FIG. 45, a metal or polysilicon layer 1606 is formed to fill a remainder of the BDTI trench 1601. In some embodiments, a planarization process is performed after forming the metal or polysilicon layer 1606 to form a planar surface that extends along an upper surface of the oxide layer 1604 and metal or polysilicon layer 1606. Although not illustrated in FIG. 45, a plurality of color filters and microlens structures can be subsequently formed over the back-side 124 of the substrate 102 to provide the structure previously illustrated in FIG. 16.

Turning now to FIGS. 46-52, one can see a series of cross-sectional views that collectively depict a fourth method for forming a CMOS image sensor having a boundary deep trench isolation (BDTI) structure and a pixel deep trench isolation (PDTI) structure. As shown in cross-sectional view 4600 of FIG. 46, a substrate 102 is provided. A photodiode is formed within the substrate 102, by forming a doped layer 108 having a second doping type (e.g., n-type dopant (e.g., phosphorous)) within a front-side 122 of the substrate 102. Though not shown in FIG. 46, a BEOL metallization stack comprising a plurality of metal interconnect layers arranged within an ILD layer (e.g. referring to FIG. 30 for the BEOL metallization stack 3010) can be formed over the front-side 122 of the substrate 102. After the BEOL metallization stack is formed, the substrate 102 is flipped over for further processing on a back-side 124 that is opposite to the front-side 122. The substrate 102 is selectively etched to form a PDTI trench 1603 within the back-side 124 of the substrate 102 within adjacent pixel regions 103a, 103b.

Figure 47:
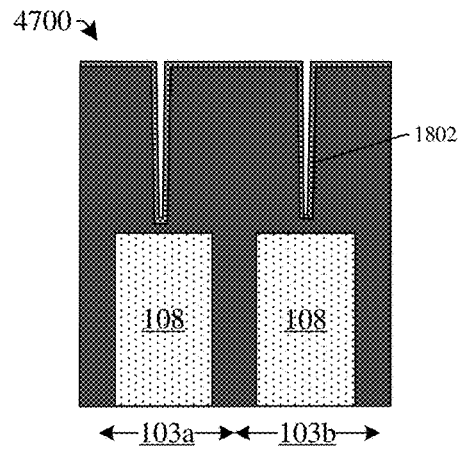

As shown in cross-sectional view 4700 of FIG. 47, anti-reflective coating (ARC) layer (not shown) is conformally deposited along sidewalls of the PDTI trench 1603, and a first high-k dielectric layer 1802 is conformally deposited along inner sidewalls of the PDTI trench 1603 (and/or along inner sidewalls of ARC layer, if present). The first high-k dielectric layer 1802 may be formed by deposition techniques and may comprise aluminum oxide (AlO), hafnium oxide (HfO), tantalum oxide (TaO) or other dielectric materials having a dielectric constant greater than that of silicon oxide.

Figure 48:
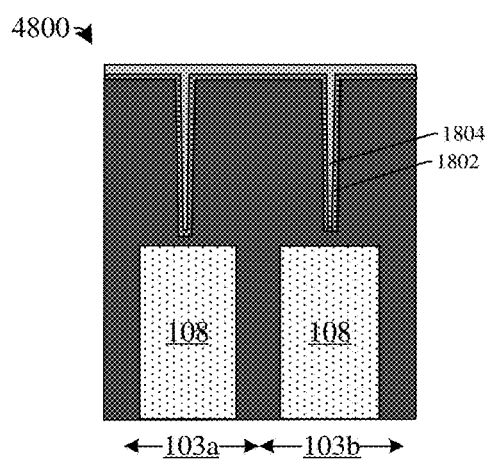

As shown in cross-sectional view 4800 of FIG. 48, a first oxide layer 1804 is formed on the first high-k dielectric layer 1802 and fills a reminder of the PDTI trenches, and a chemical mechanical planarization (CMP) process is optionally carried out. In some embodiments, the first oxide layer 1804 and the first high-k dielectric layer 1802 may extend over the back-side 124 of the substrate 102. In some embodiments, the first high-k dielectric layer 1802 and the first oxide layer 1804 may be deposited using a physical vapor deposition technique, an atomic layer deposition technique, or a chemical vapor deposition technique.

Figure 49:
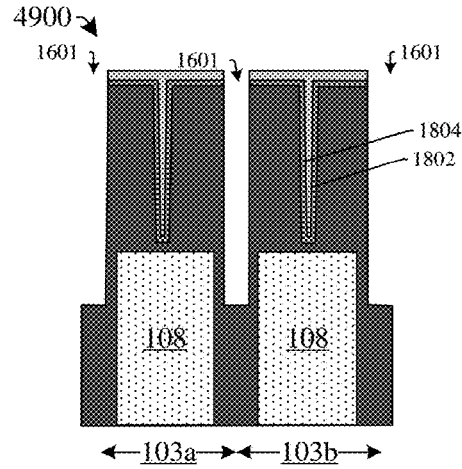

As shown in cross-sectional view 4900 of FIG. 49, the substrate 102 is selectively etched to form a BDTI trench 1601 at outer boundaries of adjacent pixel regions 103*a*, 103*b*.

Figure 50:
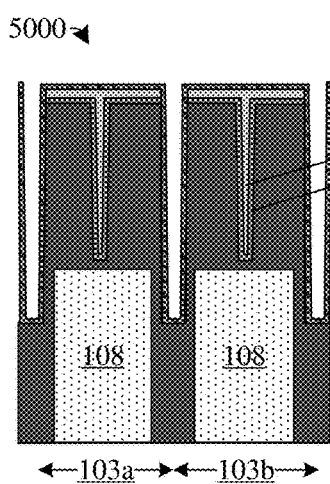

As shown in cross-sectional view 5000 of FIG. 50, a second high-k dielectric layer 1806 is formed along inner sidewalls of the BDTI trench 1601, and over the upper surface of the first oxide layer 1804.

Figure 51:
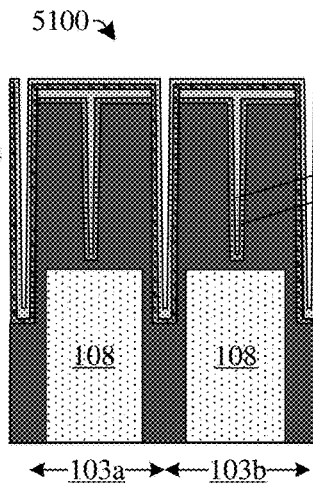

As shown in cross-sectional view 5100 of FIG. 51, a second oxide layer 1808 is formed over the second high-k dielectric layer 1806. The second oxide layer 1808 partially fills the BDTI trench 1601.

Figure 52:
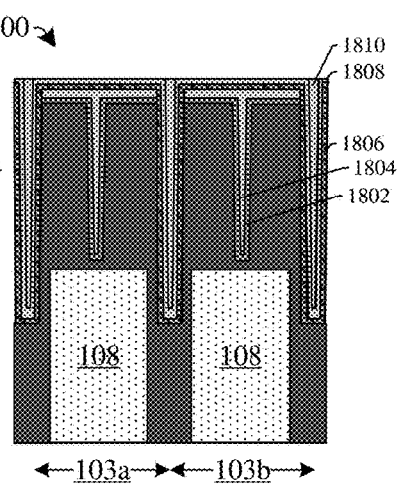

As shown in cross-sectional view 5200 of FIG. 52, a metal or polysilicon layer 1810 is formed to fill a remainder of the BDTI trench 1601. In some embodiments, a planarization process is performed after forming the metal or polysilicon layer 1606 to form a planar surface that extends along an upper surface of the second oxide layer 1808 and metal or polysilicon layer 1810. Although not illustrated in FIG. 52, a plurality of color filters and microlens structures can be subsequently formed over the back-side 124 of the substrate 102 to provide the structure previously illustrated in FIG. 18.

Turning now to FIGS. 53-59, one can see a series of cross-sectional views that collectively depict a fifth method for forming a CMOS image sensor having a boundary deep trench isolation (BDTI) structure and a pixel deep trench isolation (PDTI) structure. As shown in cross-sectional view 5300 of FIG. 53, a substrate 102 is provided. A photodiode is formed within the substrate 102, by forming a doped layer 108 having a second doping type (e.g., n-type dopant (e.g., phosphorous)) within a front-side 122 of the substrate 102. Though not shown in FIG. 53, a BEOL metallization stack comprising a plurality of metal interconnect layers arranged within an ILD layer (e.g. referring to FIG. 30 for the BEOL metallization stack 3010) can be formed over the front-side 122 of the substrate 102.

Figure 53:
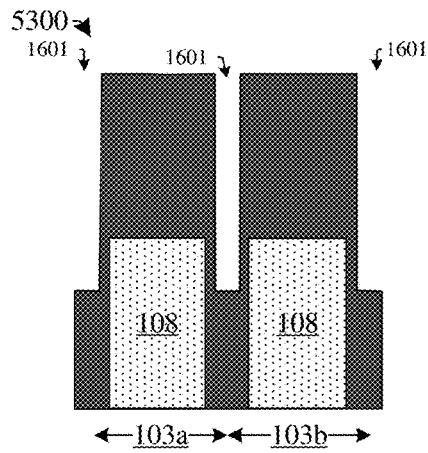
FIGS. 53-59 depict a series of cross-sectional views that collectively depict a fifth method of forming a CMOS image sensor in accordance with some embodiments.

As shown in cross-sectional view 5300 of FIG. 53, the substrate 102 is flipped over for further processing on a back-side 124 that is opposite to the front-side 122. The substrate 102 is selectively etched to form a BDTI trench 1601 within the back-side 124 of the substrate 102 along outer boundaries of the pixel regions 103*a*, 103*b*.

Figure 54:
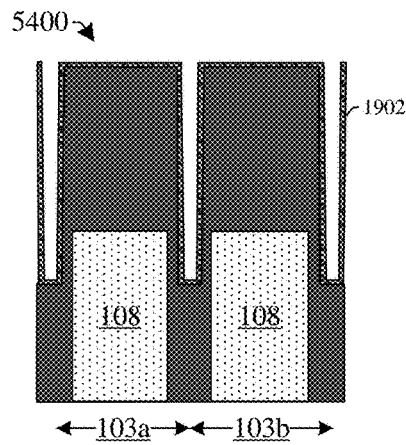

As shown in cross-sectional view 5400 of FIG. 54, anti-reflective coating (ARC) layer (not shown) is conformally deposited along sidewalls of the BDTI trench 1601, and a first high-k dielectric layer 1902 is conformally deposited along inner sidewalls of the BDTI trench 1601 (and/or along inner sidewalls of ARC layer, if present). The first high-k dielectric layer 1902 may be formed by deposition techniques and may comprise aluminum oxide (AlO), hafnium oxide (HfO), tantalum oxide (TaO) or other dielectric materials having a dielectric constant greater than that of silicon oxide.

Figure 55:
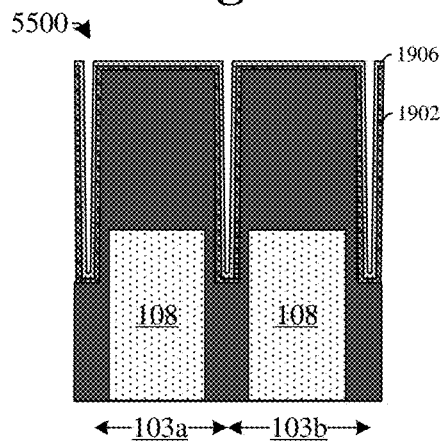

As shown in cross-sectional view 5500 of FIG. 55, a first oxide layer 1906 is formed on the first high-k dielectric layer 1902 and partially fills the BDTI trenches, and a chemical mechanical planarization (CMP) process is optionally carried out. In some embodiments, the first oxide layer 1906 and the first high-k dielectric layer 1902 may extend over the back-side 124 of the substrate 102. In some embodiments, the first high-k dielectric layer 1902 and the first oxide layer 1906 may be deposited using a physical vapor deposition technique, an atomic layer deposition technique, or a chemical vapor deposition technique.

Figure 56:
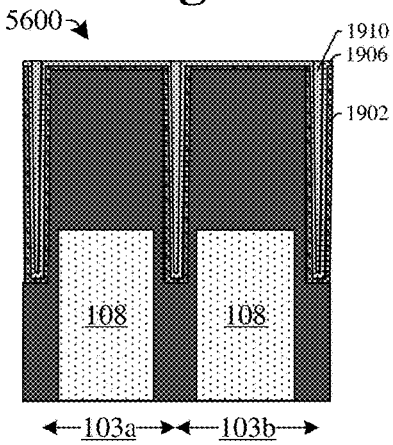

As shown in cross-sectional view 5600 of FIG. 56, a metal or polysilicon layer 1910 is formed to fill a remainder of the BDTI trenches 1601. In some embodiments, a planarization process is performed after forming the metal or polysilicon layer 1910 to form a planar surface.

Figure 57:
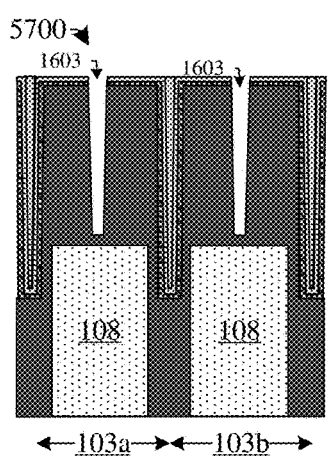

As shown in cross-sectional view 5700 of FIG. 57, the substrate 102 is selectively etched to form a PDTI trench 1603 within the pixels regions 103*a*, 103*b*.

Figure 58:
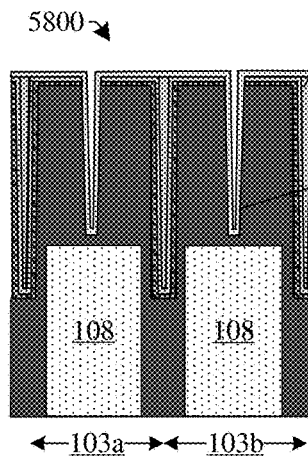
Figure 59:
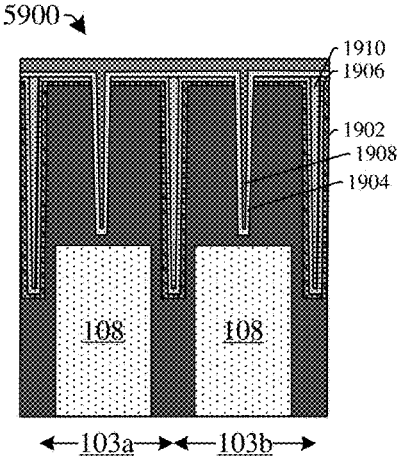
Figure 60:
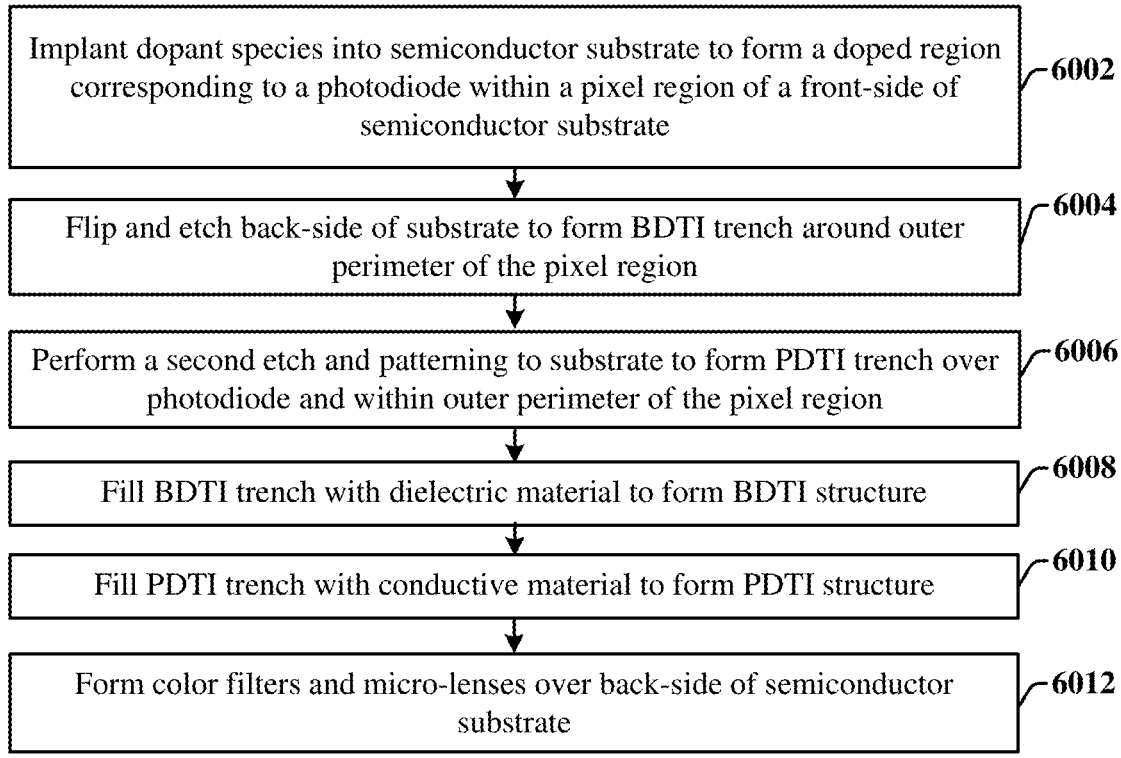
FIG. 60 illustrates a flow diagram of some embodiments of a method of forming a CMOS image sensor having a BDTI structure and a PDTI structure.

As shown in cross-sectional view 5800 of FIG. 58, a second high-k dielectric layer 1904 is formed along inner sidewalls of the PDTI trench 1603, and over the upper surface of the structure As shown in cross-sectional view 5900 of FIG. 59, a second oxide layer 1908 is formed over the second high-k dielectric layer 1904. The second oxide layer 1808 fills the remainder of the PDTI trench 1603. In some embodiments, a planarization process is performed after forming the second oxide layer 1908 to form a planar surface that extends along an upper surface of the second oxide layer 1808 and metal or polysilicon layer 1810. Although not illustrated in FIG. 59, a plurality of color filters and microlens structures can be subsequently formed over the back-side 124 of the substrate 102 to provide the structure previously illustrated in FIG. 19.

FIG. 60 illustrates a flow diagram of some embodiments of a method 6000 of forming a CMOS image sensor having a pixel deep trench isolation (PDTI) structure over a photodiode and a boundary deep trench isolation (BDTI) structure laterally surrounding the PDTI structure.

At act 6002, a substrate is prepared. A photodiode is formed within the front-side of the substrate, including a doped layer with a first doping type (e.g. n-type) formed within a front-side of the substrate and an adjoining region of the substrate with a second doping type (e.g. p-type). The substrate may be prepared including a blanket implant or a grading epitaxial growth process with the second doping type (e.g. p-type). The doped layer may be formed by implanting dopant species with the first doping type (e.g. an n-type dopant (e.g., phosphorous). The implant dopant species forms a doped region corresponding to a photodiode within a pixel region of the front-side of semiconductor substrate.

At act 6004, the substrate is flipped over for further processing. A back-side of the substrate is selectively etched to form a BDTI trench extending into the substrate. The BDTI trench is formed between adjacent pixel regions and surrounds an outer perimeter of the pixel region.

At act 6006, a second etch process is performed to form a PDTI trench extending into the substrate over the photodiode and within the outer perimeter of the pixel regions.

At act 6008, the BDTI trench is filled with dielectric material to form a BDTI structure.

At act 6010, the PDTI trench is filled with conductive material, such as a metal or polysilicon, to form a PDTI structure.

At act 6012, color filters and micro-lenses are formed over the back-side of the semiconductor substrate.

Some embodiments relate to a CMOS image sensor disposed on a substrate. A plurality of pixel regions comprising a plurality of photodiodes, respectively, are configured to receive radiation that enters a back-side of the substrate. A boundary deep trench isolation (BDTI) structure is disposed at boundary regions of the pixel regions, and includes a first set of BDTI segments extending in a first direction and a second set of BDTI segments extending in a second direction perpendicular to the first direction to laterally surround the photodiode. The BDTI structure comprises a first material. A pixel deep trench isolation (PDTI) structure is disposed within the BDTI structure and overlies the photodiode. The PDTI structure comprises a second material that differs from the first material, and includes a first PDTI segment extending in the first direction such that the first PDTI segment is surrounded by the BDTI structure.

Some other embodiments relate to a method. In the method, a substrate having a front-side and a back-side is received. A plurality of photodiodes is formed within the front-side of the substrate, wherein a photodiode corresponds to a pixel region. The back-side of the substrate is selectively etched to form a boundary deep trench isolation (BDTI) trench extending into the back-side of the substrate. The BDTI trench laterally surrounds an outer perimeter of the pixel region and laterally separates the pixel region from adjacent pixel regions. The back-side of the substrate is selectively etched to form a pixel deep trench isolation (PDTI) trench extending into the back-side of the substrate over the photodiode and within the outer perimeter of the pixel region. The BDTI trench is filled with a first material to form a BDTI structure. The PDTI trench is filled with a second material to form a PDTI structure which is laterally surrounded by the BDTI structure and which overlies the photodiode.

In yet other embodiments, the present disclosure relates to a CMOS image sensor. The CMOS image sensor includes a substrate having a front-side and a back-side opposite to the front-side. A plurality of pixel regions respectively include a plurality of photodiodes, respectively, which are configured to receive radiation that enters the substrate from the back-side. A boundary deep trench isolation (BDTI) structure extends from the back-side of the substrate to a first depth into the substrate and is disposed at an outer perimeter of the plurality of pixel regions. The BDTI structure includes a first material and has an innermost perimeter that laterally surrounds the plurality of pixel regions as viewed from above. A pixel deep trench isolation (PDTI) structure extends from the back-side of the substrate to a second depth into the substrate. The PDTI structure includes a first set of segments extending in a first direction and a second set of segments perpendicularly traversing the first set of segments and laterally surrounded by the BDTI structure. The PDTI structure includes a second material that differs from the first material and the first set of segments and second set of segments laterally separate adjacent pixel regions from one another.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure and that they may make various changes, substitutions, and alterations herein without departing from the spirit and scope of the present disclosure.

What is claimed is:

1. A CMOS image sensor, comprising:
   a substrate having a front-side and a back-side over the front-side;
   a plurality of pixel regions comprising a plurality of photodiodes, respectively, configured to receive radiation that enters the substrate from the back-side;
   a boundary deep trench isolation (BDTI) structure disposed at boundary regions of the pixel regions and including a first set of BDTI segments extending in a first direction and a second set of BDTI segments extending in a second direction perpendicular to the first direction, such that the BDTI structure laterally surrounds a first photodiode of the plurality of photodiodes, the BDTI structure comprising a first material; and
   a pixel deep trench isolation (PDTI) structure disposed within the BDTI structure, the PDTI structure having a bottom surface directly contacting an upper surface of the first photodiode, wherein the PDTI structure comprises a second material that differs from the first material, and includes a first PDTI segment extending in the first direction such that the first PDTI segment is surrounded by the BDTI structure.

2. The CMOS image sensor of claim 1, wherein the first material of the BDTI structure comprises a metal or polysilicon, and the second material of the PDTI structure comprises an oxide.

3. The CMOS image sensor of claim 1, wherein the PDTI structure comprises a lower portion having outer sidewalls contacting inner sidewalls of the first photodiode.

4. The CMOS image sensor of claim 1, wherein the first material comprises an oxide and the second material comprises a metal or polysilicon.

5. The CMOS image sensor of claim 1, wherein a first BDTI segment of the first set of BDTI segments has a first cross-sectional width as measured in the first direction and the first PDTI segment has a second cross-sectional width as measured in the first direction, the first cross-sectional width being greater than the second cross-sectional width and the first and second cross-sectional widths being measured at a first depth from the back-side of the substrate.

6. The CMOS image sensor of claim 1, further comprising: a second PDTI segment extending in the second direction and splitting the first PDTI segment into two portions such that the first PDTI segment and the second PDTI segment are surrounded by the BDTI structure.

7. The CMOS image sensor of claim 6, wherein the first PDTI segment and the second PDTI segment have outermost ends that are fully separated from the BDTI structure by a region of the substrate.

8. The CMOS image sensor of claim 5, further comprising a second PDTI segment extending in the second direction such that the first PDTI segment and the second PDTI segment facilitate the PDTI structure having a ring shape when viewed in a top view.

9. The CMOS image sensor of claim 1, wherein the PDTI structure includes a first plurality of PDTI segments extending in parallel with one another in the first direction, and a second plurality of PDTI segments extending in parallel with one another and perpendicular to the first plurality of PDTI segments.

10. The CMOS image sensor of claim 1, wherein the BDTI structure has protrusions extending inwardly from inner sidewalls of the BDTI structure, and wherein the protrusions are aligned with outer ends of the first PDTI segment.

11. The CMOS image sensor of claim 1, wherein the BDTI structure extends from the back-side of the substrate to a first depth within the substrate and the PDTI structure extends from the back-side of the substrate to a second depth within the substrate, the second depth less than the first depth.

12. The CMOS image sensor of claim 1, further comprising a plurality of color filters disposed at the back-side of the substrate corresponding to the plurality of photodiodes of the plurality of pixel regions, the plurality of color filters overlying the PDTI structure.

13. The CMOS image sensor of claim 12, further comprising a plurality of micro-lenses overlying the plurality of color filters, respective micro-lenses are aligned correspondingly with the plurality of color filters.

14. An integrated circuit, comprising:
a substrate having a front-side and a back-side;
a plurality of photodiodes within the front-side of the substrate, wherein a photodiode corresponds to a pixel region;
a boundary deep trench isolation (BDTI) trench extending into the back-side of the substrate, the BDTI trench laterally surrounding an outer perimeter of the pixel region and laterally separating the pixel region from adjacent pixel regions;
a pixel deep trench isolation (PDTI) trench extending into the back-side of the substrate over the photodiode and within the outer perimeter of the pixel region;
a first high-k dielectric layer lining inner sidewalls of the BDTI trench;
a first material filler within inner sidewalls of the BDTI trench, wherein the first high-k dielectric layer and first material filler define a BDTI structure;
a second high-k dielectric layer lying along the back-side of the substrate and lining inner sidewalls of the PDTI trench; and
a second material filler lining inner sidewalls of the second high-k dielectric layer and filling the PDTI trench, wherein the second high-k dielectric layer and the second material filler define a PDTI structure;
wherein the PDTI structure is laterally surrounded by the BDTI structure and directly contacts sidewalls of the first high-k dielectric layer.

15. The integrated circuit of claim 14, wherein the first material filler comprises a metal and the second material filler comprises an oxide.

16. The integrated circuit of claim 14, wherein the first material filler comprises an oxide and the second material filler comprises a metal.

* * * * *